United States Patent
Deaver, Sr. et al.

(10) Patent No.: US 7,965,193 B2
(45) Date of Patent: *Jun. 21, 2011

(54) SYSTEM AND METHOD FOR DETECTING DISTRIBUTION TRANSFORMER OVERLOAD

(75) Inventors: Brian J. Deaver, Sr., Fallston, MD (US); William O. Radtke, Ellicott City, MD (US)

(73) Assignee: Current Technologies, LLC, Germantown, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/714,936

(22) Filed: Mar. 1, 2010

(65) Prior Publication Data

US 2010/0156649 A1    Jun. 24, 2010

Related U.S. Application Data

(63) Continuation of application No. 11/756,858, filed on Jun. 1, 2007, now Pat. No. 7,701,357, which is a continuation-in-part of application No. 11/555,740, filed on Nov. 2, 2006, now Pat. No. 7,795,877.

(51) Int. Cl.
    *G08B 21/00* (2006.01)
(52) U.S. Cl. .................................................. 340/646
(58) Field of Classification Search .......... 340/646, 340/657, 661–664; 361/35
    See application file for complete search history.

(56) References Cited

U.S. PATENT DOCUMENTS

| | | | |
|---|---|---|---|
| 1,790,024 A | | 1/1931 | Rump |
| 3,793,559 A | * | 2/1974 | Ristuccia ................ 361/36 |
| 4,419,619 A | | 12/1983 | Jindrick et al. |
| 4,654,806 A | * | 3/1987 | Poyser et al. ............. 700/292 |
| 5,414,400 A | | 5/1995 | Gris et al. |
| 6,445,196 B1 | | 9/2002 | White |
| 6,711,512 B2 | | 3/2004 | Noh |
| 6,810,069 B2 | * | 10/2004 | Kojovic et al. ............ 373/60 |

(Continued)

OTHER PUBLICATIONS

"International Search Report", *International Search* Report Dated May 7, 2008, PCT/US07/82762.

(Continued)

*Primary Examiner* — Phung Nguyen
(74) *Attorney, Agent, or Firm* — Mel Barnes; Capital Legal Group, PLLC

(57) ABSTRACT

A system, device, and method of detecting an overload condition of a distribution transformer that supplies power to one or more customer premises via a low voltage subnet is provided. In one embodiment, the method comprises determining the power output of the transformer; storing in a memory a threshold power value for the transformer; determining whether the power output exceeds the threshold power value; and, if the output power exceeds the threshold power value, providing a notification. Providing the notification may include wirelessly transmitting the notification and/or transmitting the notification over a medium voltage power line. The low voltage subnet may comprise a low voltage feeder that supplies power to a plurality of low voltage supply lines that extend to the customer premises in which case determining the output power may comprise measuring a voltage of the low voltage feeder and measuring a current traversing the low voltage feeder. The method may also comprise storing in the memory a plurality of threshold power values associated with a plurality of transformers, such as different models of transformers; receiving data of the power output of a multitude of transformers; and determining whether the power output of each of the multitude of transformers exceeds the threshold value associated with the transformer, which steps may be performed at a central computer system such as a power line server.

31 Claims, 10 Drawing Sheets

U.S. PATENT DOCUMENTS

| | | |
|---|---|---|
| 6,906,630 B2 * | 6/2005 | Georges et al. ............... 340/646 |
| 7,089,125 B2 | 8/2006 | Sonderegger |
| 2002/0113599 A1 | 8/2002 | Hoffman |
| 2002/0161558 A1 | 10/2002 | Georges et al. |
| 2004/0021455 A1 | 2/2004 | Staats |
| 2005/0083206 A1 | 4/2005 | Couch et al. |
| 2005/0096772 A1 | 5/2005 | Cox et al. |
| 2005/0223782 A1 | 10/2005 | Dohi et al. |
| 2006/0033454 A1 | 2/2006 | Mathews et al. |
| 2006/0036795 A1 | 2/2006 | Leach |
| 2006/0106554 A1 | 5/2006 | Borkowski et al. |
| 2006/0192672 A1 | 8/2006 | Gidge et al. |
| 2006/0201264 A1 | 9/2006 | Dohi et al. |
| 2006/0251147 A1 | 11/2006 | Balan |
| 2007/0014062 A1 | 1/2007 | Fischer |
| 2007/0052426 A1 | 3/2007 | Wells et al. |
| 2007/0108986 A1 | 5/2007 | Moore et al. |
| 2007/0171958 A1 | 7/2007 | Hoang et al. |
| 2007/0200553 A1 | 8/2007 | Morrison |
| 2008/0106425 A1 | 5/2008 | Deaver et al. |
| 2008/0106426 A1 | 5/2008 | Deaver et al. |
| 2009/0187358 A1 | 7/2009 | Deaver, Sr. |

OTHER PUBLICATIONS

"Written Opinion", *Written Opinion* Dated May 7, 2008, PCT/US07/82762.

* cited by examiner

SYSTEM AND METHOD FOR DETECTING DISTRIBUTION TRANSFORMER OVERLOAD

CROSS REFERENCE TO RELATED APPLICATIONS

This application is a continuation of, and claims priority to, U.S. patent application Ser. No. 11/756,858, filed Jun. 1, 2007, now U.S. Pat. No. 7,701,357, which is a continuation-in-part of U.S. patent application Ser. No. 11/555,740 filed Nov. 2, 2006, now U.S. Pat. No. 7,795,877, which are all incorporated herein by reference in their entirety for all purposes.

FIELD OF THE INVENTION

The present invention generally relates to methods and apparatus for monitoring power distribution parameters, and more particularly to methods and apparatus for detecting distribution transformer overload.

BACKGROUND OF THE INVENTION

Distribution transformers are parts of the power system infrastructure. The power system infrastructure includes power lines, transformers and other devices for power generation, power transmission, and power delivery. A power source generates power, which is transmitted along high voltage (HV) power lines for long distances. Typical voltages found on HV transmission lines range from 69 kilovolts (kV) to in excess of 800 kV. The power signals are stepped down to medium voltage (MV) power signals at regional substation transformers. MV power lines carry power signals through neighborhoods and populated areas. Typical voltages found on MV power lines power range from about 1000 V to about 100 kV. The power signals are stepped down further to low voltage (LV) levels at distribution transformers. LV power lines typically carry power signals having voltages ranging from about 100 V to about 600 V to customer premises.

In the United States local distribution transformers typically feed anywhere from one to ten homes, depending upon the concentration of the customer premises in a particular area. A power distribution system for a given area may include many distribution transformers. Thus, the replacement costs and maintenance costs for distribution transformers can be a significant factor in the cost of power distribution.

One factor that adversely affects the life and operation of a distribution transformer is a power overload. A distribution transformer is rated to handle power signals within a given power range. Overloading a given distribution transformer may reduce the useful life of the transformer. In particular, an overload increases the temperature of the transformer windings, which in turn increases the temperature of the transformer insulation. A breakdown of the transformer's insulation, such as from the increased temperature, decreases the useful life of the transformer and increases the chances of a transformer failure. In fact the cause of most transformer failures is a breakdown of the insulation, so anything that adversely affects the insulating properties inside the transformer reduces transformer life. Overloading a distribution transformer is one of the prime causes of insulation breakdown. In brief, loading a transformer over its rating for an extended period of time or at multiples of its nameplate rating for a brief period of time will reduce the transformer's life expectancy.

One challenge to the efficient maintenance of a distribution transformer is that an overload can not be detected and monitored directly. An overload may be inferred from load flow models. Commonly however, it is when the transformer fails that an overload condition is specifically identified. Further, there are many different sized transformers (with correspondingly different power ratings) in a power distribution system. However, the specific size and rating of a specific transformer is not directly monitored. Instead the transformer size and rating typically is inferred based on statistical usage information. Accordingly, there is a need for detecting and monitoring overload conditions at the many distribution transformers in a power distribution system.

SUMMARY OF THE INVENTION

The present invention provides a system, device, and method of detecting an overload condition of a distribution transformer that supplies power to one or more customer premises via a low voltage subnet. In one embodiment, the method comprises determining the power output of the transformer; storing in a memory a threshold power value for the transformer; determining whether the power output exceeds the threshold power value; and, if the output power exceeds the threshold power value, providing a notification. Providing the notification may include wirelessly transmitting the notification and/or transmitting the notification over a medium voltage power line. The low voltage subnet may comprise a low voltage feeder that supplies power to a plurality of low voltage supply lines that extend to the customer premises in which case determining the output power may comprise measuring a voltage of the low voltage feeder and measuring a current traversing the low voltage feeder. The method may also comprise storing in the memory a plurality of threshold power values associated with a plurality of transformers, such as different models of transformers; receiving data of the power output of a multitude of transformers; and determining whether the power output of each of the multitude of transformers exceeds the threshold value associated with the transformer, which steps may be performed at a central computer system such as a power line server.

The invention will be better understood by reference to the following detailed description taken in conjunction with the accompanying drawings.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

In the following description, for purposes of explanation and not limitation, specific details are set forth, such as particular networks, communication systems, computers, terminals, devices, components, techniques, data and network protocols, power line communication systems (PLCSs), software products and systems, enterprise applications, operating systems, development interfaces, hardware, etc. in order to provide a thorough understanding of the present invention. However, it will be apparent to one skilled in the art that the present invention may be practiced in other embodiments that depart from these specific details. Detailed descriptions of well-known networks, communication systems, computers, terminals, devices, PLCSs, components, techniques, data and network protocols, software products and systems, operating systems, development interfaces, and hardware are omitted so as not to obscure the description of the present invention.

According to an embodiment of the present invention, a power line communication and power distribution parameter measurement system may gather data for determining distribution transformer load conditions, including a transformer overload condition. In one embodiment the load of a given distribution transformer at a given time is determined by measuring the transformer's output current and comparing that measured current to a rated current for the distribution transformer. The output current may be measured by a power distribution parameter sensor device. In another embodiment, the load of a given distribution transformer may be derived by gathering power usage data from the power meters at all of the premises served by the distribution transformer. For example, a comparison of the obtained power usage data from a given meter over a given time provides a measure of the power load drawn by the premises associated with the given meter. Taking the sum of measures for corresponding time periods at all of the power meters served by the given distribution transformer provides a measure of the power load over the given time period for the transformer. According to either embodiment a measure of power load at a given distribution transformer may be obtained. Such measure may be compared to a rated power load for the given transformer to identify a power overload condition.

Following is a description of the power line communication and power distribution parameter measurement system, including descriptions of sample embodiments of power distribution parameter sensor devices, power line communication devices, network protocols, software, and a sample network topology. A detailed description of methods for detecting distribution transformer overload according to sample embodiments of the present invention follows thereafter.

Communication and Measurement System

Figure 1:
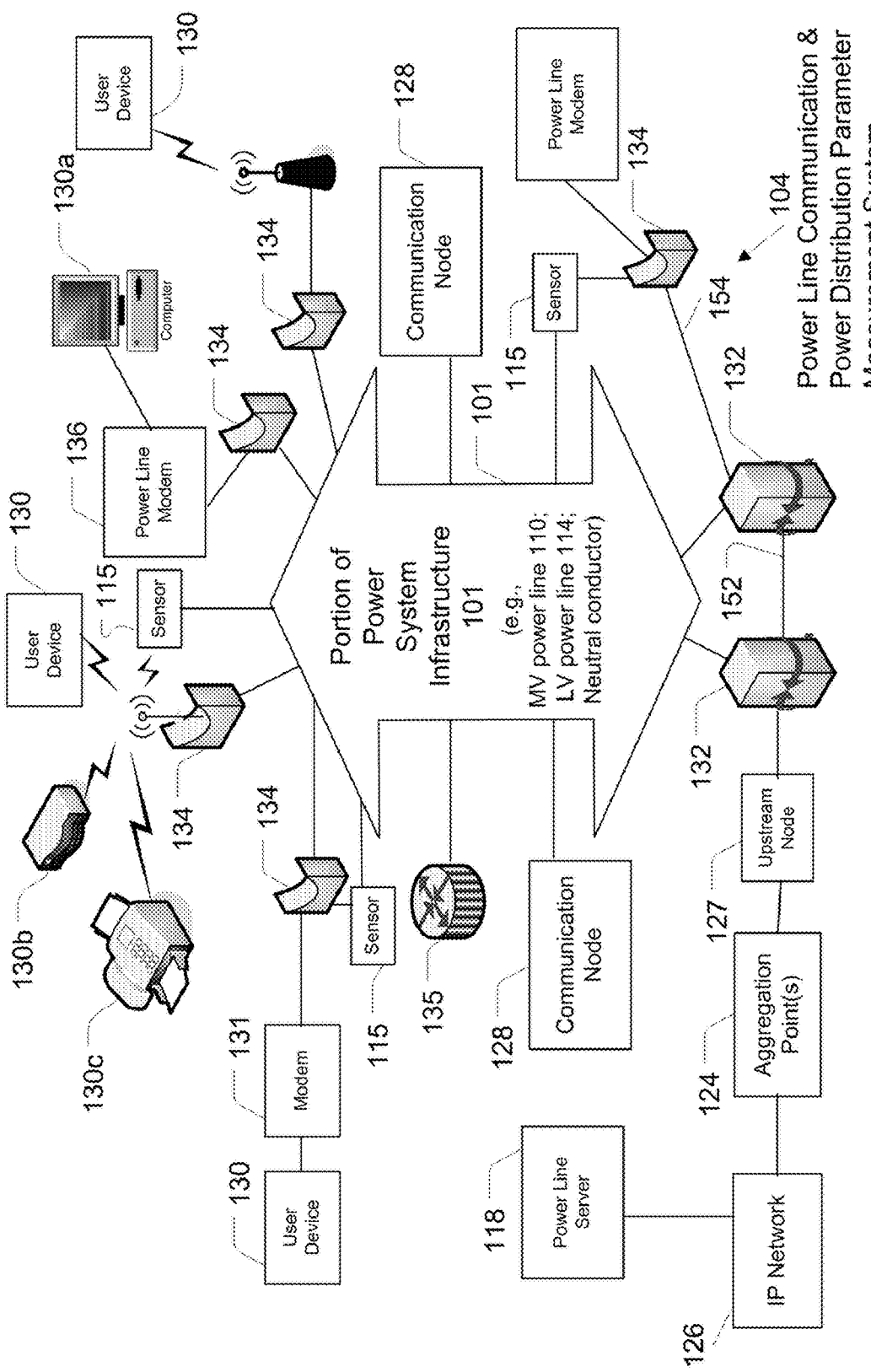
FIG. 1 is a block diagram of an example power line communication and power distribution parameter measurement system.

FIG. 1 shows a power line communication and power distribution parameter measurement system 104 for detecting distribution transformer overload according to an embodiment of the present invention. Power distribution parameter data, including load information, may be gathered from multiple points along a power distribution network, and transmitted to a utility or other processing center. For example, sensor devices 115 may be positioned along overhead and underground medium voltage power lines, and along network (external or internal) low voltage power lines.

The power line communication and distribution parameter measurement system 104 also may provide user services (i.e., communicate user data) and communication services to devices accessing the system. Exemplary services that may be provided include high speed broadband internet access, mobile telephone communications, broadband communications, streaming video and audio services, and other communication services. Such services may be provided to homes, buildings and other structures, and to each room, office, apartment, or other unit or sub-unit of multi-unit structures. Communication services also may be provided to mobile and stationary devices in outdoor areas such as customer premises yards, parks, stadiums, and also to public and semi-public indoor areas such as subway trains, subway stations, train stations, airports, restaurants, public and private automobiles, bodies of water (e.g., rivers, bays, inlets, etc.), building lobbies, elevators, etc.

The power line communication and power distribution parameter measurement system 104 includes a plurality of communication nodes 128 which form communication links using power lines 110, 114 and other communication media. One type of communication node 128 may be a backhaul node 132. Another type of communication node 128 may be an access node 134. Another type of communication node 128 may be a repeater node 135. A given node 128 may serve as a backhaul node 132, access node 134, and/or repeater node 135.

A communication link is formed between two communication nodes 128 over a communication medium. Some links may be formed over MV power lines 110. Some links may be formed over LV power lines 114. Other links may be gigabit-Ethernet links 152, 154 formed, for example, using a fiber optic cable. Thus, some links may be formed using a portion 101 of the power system infrastructure, while other links may be formed over another communication media, (e.g., a coaxial cable, a T-1 line, a fiber optic cable, wirelessly (e.g., IEEE 802.11a/b/g, 802.16, 1G, 2G, 3G, or satellite such as WildBlue®)). The links formed by wired or wireless media may occur at any point along a communication path between a backhaul node 132 and a user device 130.

Each communication node 128 may be formed by one or more communication devices. Communication nodes which communicate over a power line medium include a power line communication device. Exemplary power line communication devices include a backhaul device 138 (see FIG. 6), an access device 139 (see FIG. 8), and a repeater 135. Communication nodes which access a link over a wireless medium may include a wireless access point having at least a wireless transceiver, which may comprise mobile telephone cell site/transceiver (e.g., a micro or pico cell site) or a IEEE 802.11 transceiver (Wifi). Communication nodes which access a link over a coaxial cable may include a cable modem. Communication nodes which access a link over a twisted pair may include a DSL modem. A given communication node typically will communicate in two directions (either full duplex or half duplex), which may be over the same or different types of communication media. Accordingly, a communication node 128 may include one, two or more communication devices, which may be formed along the same or different types of communication media.

A backhaul node 132 may serve as an interface between a power line medium (e.g., an MV power line 110) of the system 104 and an upstream node 127, which may be, for example, connected to an aggregation point 124 that may provide a connection to an IP network 126. The system 104 typically includes one or more backhaul nodes 132. Upstream communications from user premises and control and monitoring communications from power line communication devices may be communicated to an access node 134, to a backhaul node 132, and then transmitted to an aggregation point 124 which is communicatively coupled to the IP network 126. Communications may traverse the IP network to a destination, such as a web server, power line server 118, or an end user device. The backhaul node 132 may be coupled to the aggregation point 124 directly or indirectly (i.e., via one or more intermediate nodes 127). The backhaul node 132 may communicate with its upstream device via any of several alternative communication media, such as a fiber optic cable (digital or analog (e.g., Wave Division Multiplexed)), coaxial cable, WiMAX, IEEE 802.11, twisted pair and/or another wired or wireless media. Downstream communications from the IP network 126 typically are communicated through the aggregation point 124 to the backhaul node 132. The aggregation point 124 typically includes an Internet Protocol (IP) network data packet router and is connected to an IP network backbone, thereby providing access to an IP network 126 (i.e., can be connected to or form part of a point of presence or POP). Any available mechanism may be used to link the aggregation point 124 to the POP or other device (e.g., fiber optic conductors, T-carrier, Synchronous Optical Network (SONET), and wireless techniques).

An access node 134 may transmit data to and receive data from, one or more user devices 130 or other network destinations. Other data, such as power line parameter data (e.g., current measured by a power line current sensor device) may be received by an access node's power line communication device 139. The data enters the network 104 along a communication medium coupled to the access node 134. The data is routed through the network 104 to a backhaul node 132. Downstream data is sent through the network 104 to a user device 130. Exemplary user devices 130 include a computer 130a, LAN, a WLAN, router 130b, Voice-over IP endpoint, game system, personal digital assistant (PDA), mobile telephone, digital cable box, security system, alarm system (e.g., fire, smoke, carbon dioxide, security/burglar, etc.), stereo system, television, fax machine 130c, HomePlug residential network, or other user device having a data interface. The system also may be use to communicate utility usage data from a automated gas, water, and/or electric power meter. A user device 130 may include or be coupled to a modem to communicate with a given access node 134. Exemplary modems include a power line modem 136, a wireless modem 131, a cable modem, a DSL modem or other suitable modem or transceiver for communicating with its access node.

A repeater node 135 may receive and re-transmit data (i.e., repeat), for example, to extend the communications range of other communication elements. As a communication traverses the communication network 104, backhaul nodes 132 and access nodes 134 also may serve as repeater nodes 135, (e.g., for other access nodes and other backhaul nodes 132). Repeaters may also be stand-alone devices without additional functionality. Repeaters 135 may be coupled to and repeat data on MV power lines or LV power lines (and, for the latter, be coupled to the internal or external LV power lines).

Various user devices 130 and power line communication devices (PLCD) may transmit and receive data over the communication links to communicate via an IP network 126 (e.g., the Internet). Communications may include measurement data of power distribution parameters, control data and user data. For example, power line parameter data and control data may be communicated to a power line server 118 for processing. A power line parameter sensor device 115 may be located in the vicinity of, and communicatively coupled to, a power line communication device 134, 135, 132 to measure or detect power line parameter data.

Power Distribution Parameter Sensor Device:

In some embodiments, a power line parameter sensor device 115 may be installed at each communication node 128 to measure power line parameters of various regions, neighborhoods and structures. The power line distribution parameter sensor device 115 may measure or detect a power distribution parameter, such as distribution transformer load, power usage, power line voltage, and power line current. Other data also may be measured (or detected) such as detection of a power outage, detection of water in a pad mount transformer enclosure, detection of an open pad mount transformer enclosure, detection of a street light failure, and measurement of power delivered to a transformer (e.g., the sensor device may be coupled to a conductor that connects the distribution transformer to the MV power line). Still other data may be measured or detected such as power factor data (e.g., the phase angle between the voltage and current of a power line), which may be determined by processing data from multiple sensor devices (i.e., current and voltage). Still other data may be measured or detected such as power delivered to a downstream branch, data of the harmonic components of a power signal, and load transients data. One skilled in the art will appreciate that still other types of parameter data also may be measured and detected. The power distribution parameter may be sampled by the power line communication device and communicated to a power line server 118, or other power line distribution management system and/or power line communication management system.

One sensor device 115 may be configured to provide data of more than one parameter. For example, a sensor device 115 may be configured to provide data of the voltage and current carried by the power line (and therefore have multiple sensor devices). One or more sensor devices 115 may be installed at a given power line 110 and/or 114 and be coupled to a corresponding power line communication device 138,139,135. For example, a power line current sensor device may be installed at power lines 110 and 114 alone or with another power line parameter sensor device (e.g., a power line voltage sensor device). Such a configuration may be used to determine the current and power into and out of a transformer. In addition, the data provided by the sensor device 115 may be used to determine additional parameters (either by the sensor device, the power line communication device, or a remote computer). For example, a sensor device 115 may be configured to measure the instantaneous voltage and current (e.g., over brief time period). The measurement data may be provided to the power line communication device 138, 139, 135 for processing. With adequate voltage and current sampling, the device 138, 138, or 135 may compute the power factor of the power line (through means well known in the art). Thus, other power line parameters may be measured using an appropriate sensor device coupled to a power line 110, 114 in the vicinity of a power line communication device 138, 139, 135 in place of, or in addition to, the power line current sensor device.

In an example embodiment, the sensor device may comprise a power line current sensor device that is formed of a Rogowski coil and such sensor device may be installed throughout a network (on both MV and LV power lines). The Rogowski coil is an electrical device for measuring alternating current (AC) or high speed current pulses. An exemplary embodiment includes a first and second helical coils of wire (loops) electrically connected in series with each other. The first loop is wound with a substantially constant winding density in a first direction around a core that has a substantially constant cross section. The second loop is wound with a substantially constant winding density in a second direction around a core that has a substantially constant cross section. A conductor (e.g., a power line) whose current is to be measured traverses through the loops. A voltage may be induced in the coil based on the rate of change of the current running through the power line. Rogowski coils may have other configurations as well.

One advantage of a Rogowski coil is that it may be open-ended and flexible, allowing it to be wrapped around an energized conductor. Also, a Rogowski coil may include an air core (or other dielectric core) rather than an iron core, which gives the coil a low inductance and an ability to respond to fast-changing currents. Further, the Rogowski coil typically is highly linear, even when subjected to large currents, such as those of low voltage and medium voltage power lines. By forming the Rogowski coil with equally spaced windings, effects of electromagnetic interference may be substantially avoided. On method of providing equal spaced windings is to use printed circuit boards to manufacture the coil. Some examples of a Rogowski coil are described in U.S. Pat. No. 6,313,623 issued on Nov. 6, 2001 for "High Precision Rogowski Coil," which is incorporated herein by reference in its entirety.

Figure 2:
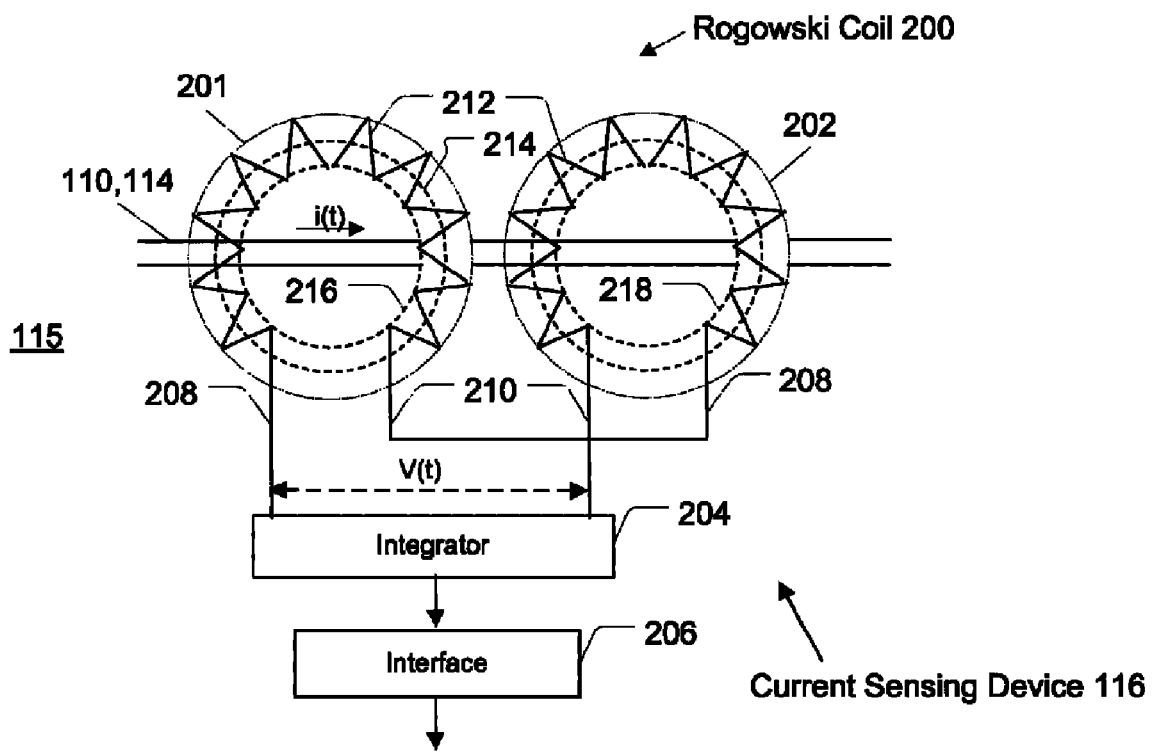
FIG. 2 is a block diagram and partial schematic of an example embodiment of a power line current sensor device.

FIG. 2 shows one example embodiment of a power line parameter sensor device 115, which comprises a power line current sensor device 116 including a Rogowski coil 200 having two loops 201, 202, an integrator 204 and an interface 206. Each loop 201, 202 has a first end 208 and a second end 210. By shaping the loops 201, 202 to bring the two ends 208, 210 toward each other, while leaving space between the ends 208, 210, the Rogowski coil 200 may be readily installed at a power line 110, 114. The coil 200 may have a generally circular shape with an open arc between the ends 208, 210 (to be slipped around the power line) or may be substantially a full closed circle (and formed in two pieces that are hinged together to clamp over the power line). One of ordinary skill in the art will appreciate that other shapes may be implemented. In this example embodiment, to install the current sensor device 116, the two pieces of the loops 201, 202 are clamped around the power line 110, 114 (which may require pulling back the power line neutral conductor for underground power lines). A power line 110, 114 passes through the circular shape as shown. An advantage of these configurations is that the power line 110, 114 may not need to be disconnected (in many instances) to install the current sensor device 116.

The coil 200 of the Rogowski coil may include a first winding 201 wound in a first direction, a second winding 202 wound in a second direction, and wherein said first winding 201 and said second winding 202 each include traces on a printed circuit board. In some embodiments the windings 201, 202 are traced on one or more printed circuit boards (PCBs) 216, 218, and then the printed circuit boards (if more than one) are coupled together to form a monolithic PCB assembly (i.e., one structure). In another embodiment, the two windings of the coil are traced together and interwoven with each other on the PCB (a multi-layer printed circuit board) and therefore may be referred to as being "coupled" together. Because the windings are traced within each other (that is, the loops are interwoven), the loops are not identical in form. In another embodiment, the windings may be traced separately on separate PCBs and have identical geometries on separate PCBs, and be positioned along the power line 110, 114 in close proximity.

As alternating current flows through the power line 110, 114, a magnetic field is generated inducing an electrical field (i.e. voltage) within each winding 201, 202 of the Rogowski coil 200. However, other sources of electromagnetic interference also may induce current flow in the windings 201, 202. By including a left-hand winding 201 and a right-hand winding 202 (i.e., windings in substantially opposite directions) with equally spaced windings, the effects from external sources are largely cancelled out. In particular, external fields from sources outside the Rogowski coil 200, such as other power lines or power line communication and distribution equipment, generate equal but opposite electrical flow in the windings 201, 202. The Rogowski coil 200 provides an instantaneous voltage measurement that is related to the alternating current (AC) flowing through the power line 110, 114.

Each winding 201, 202 of the Rogowski coil 200 comprises an electrical conductor 212 wound around a dielectric core 214 (e.g., PCB). In an example embodiment each loop 201, 202 has windings that are wound with a substantially constant density and a core 214 that has a magnetic permeability that may be equal to the permeability of free space $\mu_o$ (such as, for example, air) or a printed circuit board. In addition, the cross section of the core 214 may be substantially constant.

To obtain an expression for the voltage that is proportional to the current flowing through the power line 110, 114, the coil output voltage, v(t), may be integrated. For example, the integrator 204 may convert the measured voltage v(t) into a value equating to measured current. In example embodiments, the integrator 204 may comprise a resistor-capacitor (RC) integrator, an operational amplifier integrator, a digital filter (integrator), another circuit or a processor. Observing that the voltage v(t), is proportional to the derivative of the current being measured, and that if that current is sinusoidal, the voltage v(t) will also be sinusoidal. Thus, determining the current does not always require integration of the voltage v(t)), in which embodiment the integrator 204 may be omitted.

Referring to FIGS. 2-5, each power line distribution parameter sensor device 115 may include an interface 206 which provides communications with a power line communication device, such as a backhaul device 138, an access device 139, a repeater 135, or other communication device. In various embodiments different interfaces 206 may be implemented. In some embodiments the sensor device 115 may include an analog to digital converter (ADC). In other embodiments, raw analog data is communicated from the sensor device 115 to the power line communication device, which may convert the analog data to digital data (via an ADC) and provide processing. Such processing may include, for example, time stamping, formatting the data, normalizing the data, converting the data (e.g., converting the voltage measured by the ADC to a current value), removing an offset, and other such data processing. The processing also may be performed in the sensor device 115, in the power line communication device. Thus, the sensor device 115 of some embodiments may include a controller, an analog to digital converter (ADC), and a memory coupled to said ADC (perhaps via a controller) and configured to store current data. Alternately, the data may be transmitted to the power line server 118 or another remote computer for processing.

The overhead medium voltage power lines typically are not insulated. Thus, for sensor devices 115 which contact (e.g., are to be clamped around for a Rogowski coil) an overhead medium voltage power line or other high voltage conductor, it may be necessary to isolate the voltage (which may be 5,000-10,000 volts or more) of the power line (to which the power line parameter sensor device 116 is mounted) from the power line communication device 138, 139, 135 and other non-MV power line devices. The communication path of the measured data may comprise a non-conductive communication link that allows the data to be communicated but that does not conduct the high voltages of the MV or other power lines. For power line parameter sensor devices 115 which are clamped around an underground power line, isolation may not be necessary because underground power lines are insulated and, therefore the sensor devices 115 do not come into contact with the medium voltage.

Figure 3:
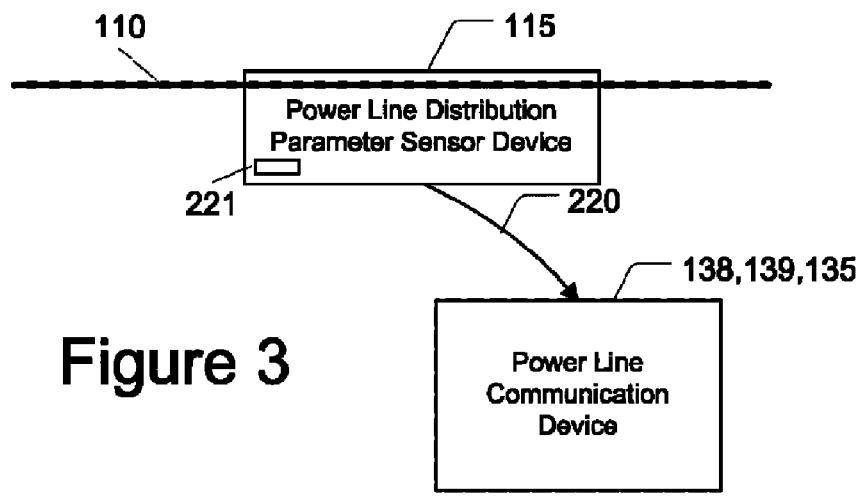
FIG. 3 is a block diagram of a power line parameter sensor device coupled to a power line communication device.
Figure 4:
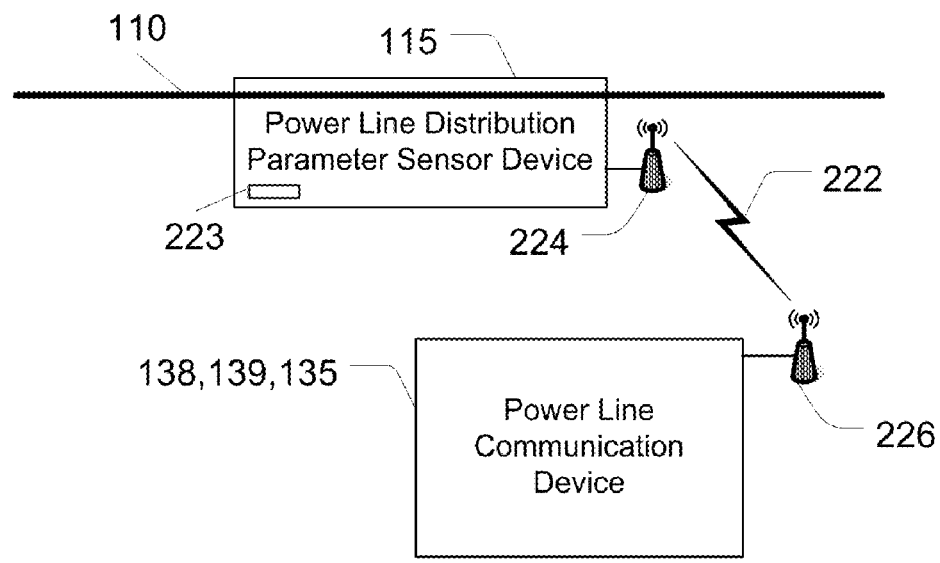
FIG. 4 is a block diagram of a power line parameter sensor device coupled to a power line communication device by a wireless medium.
Figure 5:
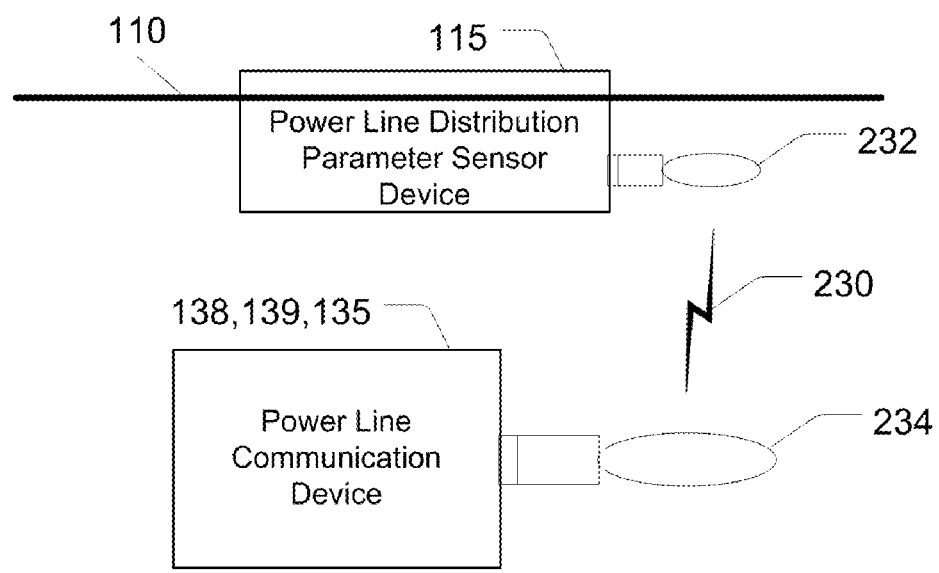
FIG. 5 is a block diagram of a power line parameter sensor device coupled to a power line communication device by a wireless medium.

FIGS. 3, 4 and 5 show different manners of coupling the power line parameter sensor device 115 to the power line communication device 138,139,135, via a non-conductive communication link to provide electrical isolation (when necessary) from the medium voltage power line 110. In FIG. 3, a wired medium 220 carries measurement data from the power line parameter sensor device 115 to the power line communication device 138, 139, 135. For underground insulated MV power lines and for low voltage power lines (which are also usually insulated), the wired medium 220 may comprise a conductive wire (i.e., a pair or wires). For overhead un-insulated MV power lines, however, the wired medium 220 may include a fiber optic cable or other wired medium that does not conduct high voltages. In such embodiment the power line parameter sensor device 115 and power line communication device 138,139,135 each may include a fiber optic transceiver (or fiber optic transmitter in the sensor device 115 and an optic receiver in the communication device). The fiber optic cable may carry analog or digitized sensor data to the power line communication device 138, 139, 135.

In some embodiments, the sensor device 115 may require a power source (i.e., an energy harvesting system) for powering the fiber optic transceiver and other components (such as an ADC) of the sensor device 115. Power may be sent over a fiber optic cable as an optical signal from the power line communication device 138, 139, 135 (or another device) to the sensor device 115. At the sensor device 115, the photonic energy is converted to electrical energy to power the fiber optic transmitter (that may form part of a transceiver) and other sensor device 115 components via a power supply 221. In other words, a photonic power delivery system may be used whereby light from a laser source illuminates a highly efficient photovoltaic power converter at the sensor device 115 to produce electrical power. An example embodiment of a photonic power supply system and method is described in U.S. patent application Ser. No. 10/292,745, filed on Nov. 12, 2002, issued as U.S. Pat. No. 7,132,819, entitled, "Floating Power Supply and Method of Using the Same," which is incorporated herein by reference in its entirety.

In an alternative embodiment the power line parameter sensor device 115 may include a different power system, such as a solar cell or battery, or kinetic energy converter (e.g., to convert vibrations to electrical energy), to provide power to the sensor device 115 circuits. As still another alternative, a power supply 221 may derive power from the power line 110 via inductance. Specifically, a transformer may be formed by a magnetically permeable core placed substantially around the entire circumference of power line 110 (perhaps with a gap) and a winding around the core. The power line 110, core, and winding form a transformer with the winding connected to the power supply 221. Current through the power line 110 induces a current in the winding, which supplies power to the sensor device 115 (for use by its transmitter and/or other components). Collectively, such power sources such as these (photonic, solar, battery, kinetic (e.g., from vibrations), and inductive power systems), which derive power via a method that isolates the MV power line voltage from the LV power line and the power line communication device, shall be referred to herein as an isolated power source. Isolated power sources other the examples described herein may be employed as well.

FIG. 4 shows an embodiment in which a wireless link 222 carries measurement data from the power line parameter sensor device 115 to the power line communication device 138, 139, 135. In such embodiment the interface 206 may include a wireless transceiver 224 (e.g., IEEE 802.11a,b,g, or n or Bluetooth®, ISM band transceiver) or wireless transmitter which communicates with a wireless transceiver 226 (or receiver) of the power line communication device 138,139, 135. In some such embodiments the power line parameter sensor device 116 also may include a power supply 223 with an isolated power source such as a solar cell, battery, a photonic power source, or an MV inductive power source, to provide power to the sensor device 115 circuits. When multiple sensor devices 115 are connected to a power line communication device 138, 139, or 135, the wireless methods may include means for coordinating the transmissions from individual sensor devices 115 so that they do not interfere with each other and so that the power line communication device can determine the source of the data. For example, a transceiver may use the ISM bands (915 MHz) and use an "ID Code" embedded in the data to identify the sensor device 115. Alternately, the links may communicate via different frequency bands.

FIG. 5 shows another embodiment in which a wireless link 230 carries measurement data from a radio frequency identification (RFID) transponder 232 of a power line parameter sensor device 115 to the power line communication device 138, 139, 135. In various embodiments the sensor device transponder 232 may be passive (having no power source of its own) or active (having its own power source). For example, in one embodiment the interface includes a passive radio transponder 232. The power line communication device 138, 139,135 also includes a transponder 234 which transmits a signal to the power line parameter sensor device 115. The strength of the transmitted signal may provide enough power to drive the power line parameter sensor device's transponder 232 and, if necessary, the device's 115 other components as well. The sensor device 115 powers up, gathers one or more samples of the power line current, voltage, and/or other data, and transmits the sampled data back to the power line communication device 138,139,135 via transponder 232. In another embodiment the sensor device includes an active radio transponder having its own power supply, which may have an isolated power source as described herein.

In various embodiments, data from the sensor devices 115 of the system or within a region or neighborhood covered by a sub-portion of the system may be sampled substantially simultaneously (e.g., all sensor devices 115 sample within a thirty second, sixty second, three minute, or five minute time period). Such samples may be gathered at a set scheduled time, at regular times, at regular intervals, or in response to a command received from a remote computer. Uses of the measured (and processed) power line parameter data are described below in more detail.

In the embodiments described herein and others, the invention may employ a communication method that reduces the power needed to communicate the measured data over the non-conductive communication link. Specifically, reducing the power needed to communicate the data allows the sensor device to communicate data when very little power is available (e.g., from the isolated power source). In one example embodiment, the sensor device 115 includes a timing circuit that periodically wakes up the sensing and memory circuits (e.g., analog to digital converter and memory) from a reduced power state (e.g., hibernation or standby state) to allow the measurement(s) to be taken (samples converted to digital data), processed, and stored in memory. In addition, after a predetermined number of measurements have been taken and the associated data stored, the communication circuitry of the interface 206 may be woken up to transmit the stored data to the power line communication device 138, 139, 135 via the non-conductive communication link (e.g., the fiber optic conductor, through the air via a wireless transmitter or transceiver, etc.).

In one example embodiment, the communication circuitry is configured to transmit a plurality of samples of the parameter data in a bursting transmission, which may comprise a relatively high transmission rate and relatively short transmission time. Specifically, over a given time period (e.g., a day) a plurality of bursts of the parameter data may be transmitted, with each burst transmitting data a plurality of the stored samples. The bursting at high data rates may allow the transmitter of the interface 206 of the sensor device 206 to remain powered down (or in a low power use state) a high percentage of the time. The bursting transmission over a time period (e.g., an hour or day) may have an extremely low duty cycle such as less than 0.01 (1%), more preferably less than 0.001 (0.1%), even more preferably less than 0.0001 (0.01%), and still more preferably less than 0.00001 (0.001%).

Backhaul Device 138:

Communication nodes, such as access nodes, repeaters, and other backhaul nodes, may communicate to and from the IP network (which may include the Internet) via a backhaul node 132. In one example embodiment, a backhaul node 132 comprises a backhaul device 138. The backhaul device 138, for example, may transmit communications directly to an aggregation point 124, or to a distribution point 127 which in turn transmits the data to an aggregation point 124.

Figure 6:
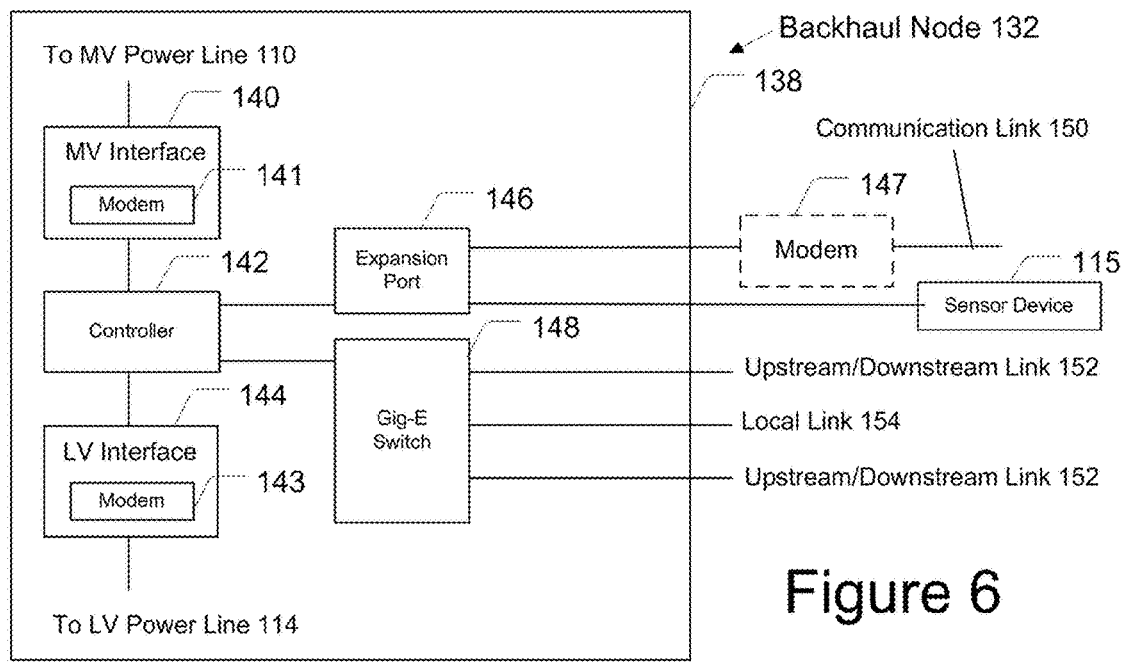
FIG. 6 is a block diagram of an example embodiment of a backhaul node.
Figure 7:
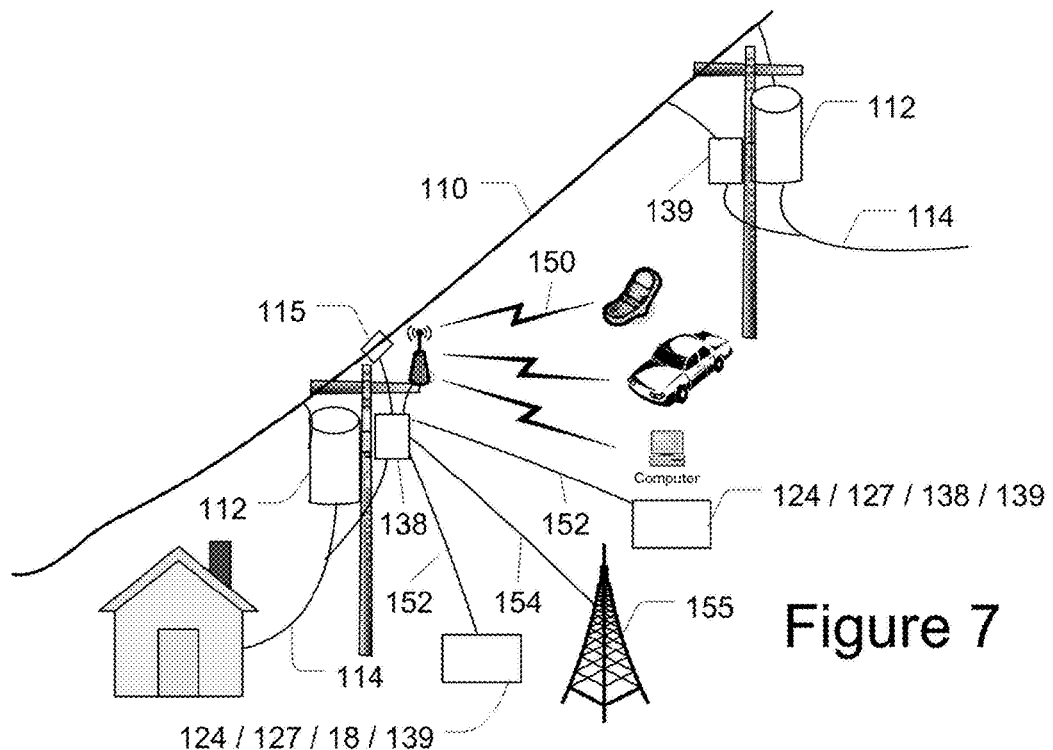
FIG. 7 illustrates an implementation of an example embodiment of a backhaul node.

FIGS. 6 and 7 show an example embodiment of a backhaul device 138 which may form all or part of a backhaul node 132. The backhaul device 138 may include a medium voltage power line interface (MV Interface) 140, a controller 142, an expansion port 146, and a gigabit Ethernet (gig-E) switch 148. In some embodiments the backhaul device 138 also may include a low voltage power line interface (LV interface) 144. The MV interface 140 is used to communicate over the MV power lines and may include an MV power line coupler coupled to an MV signal conditioner, which may be coupled to an MV modem 141. The MV power line coupler prevents the medium voltage power from passing from the MV power line 110 to the rest of the device's circuitry, while allowing the communications signal to pass between the backhaul device 138 and the MV power line 110. The MV signal conditioner may provide amplification, filtering, frequency translation, and transient voltage protection of data signals communicated over the MV power lines 110. Thus, the MV signal conditioner may be formed by a filter, amplifier, a mixer and local oscillator, and other circuits which provide transient voltage protection. The MV modem 141 may demodulate, decrypt, and decode data signals received from the MV signal conditioner and may encode, encrypt, and modulate data signals to be provided to the MV signal conditioner.

The backhaul device 138 also may include a low voltage power line interface (LV Interface) 144 for receiving and transmitting data over an LV power line 114. The LV interface 144 may include an LV power line coupler coupled to an LV signal conditioner, which may be coupled to an LV modem 143. In one embodiment the LV power line coupler may be an inductive coupler. In another embodiment the LV power line coupler may be a conductive coupler. The LV signal conditioner may provide amplification, filtering, frequency translation, and transient voltage protection of data signals communicated over the LV power lines 114. Data signals received by the LV signal conditioner may be provided to the LV modem 143. Thus, data signals from the LV modem 143 are transmitted over the LV power lines 110 through the signal conditioner and coupler. The LV signal conditioner may be formed by a filter, amplifier, a mixer and local oscillator, and other circuits which provide transient voltage protection. The LV modem 143 may demodulate, decrypt, and decode data signals received from the LV signal conditioner and may encode, encrypt, and modulate data signals to be provided to the LV signal conditioner.

The backhaul device 138 also may include an expansion port 146, which may be used to connect to a variety of devices. For example a wireless access point, which may include a wireless transceiver or modem 147, may be integral to or coupled to the backhaul device 138 via the expansion port 146. The wireless modem 147 may establish and maintain a communication link 150. In other embodiments a communication link is established and maintained over an alternative communications medium (e.g., fiber optic, cable, twisted pair) using an alternative transceiver device. In such other embodiments the expansion port 146 may provide an Ethernet connection allowing communications with various devices over optical fiber, coaxial cable or other wired medium. In such embodiment the modem 147 may be an Ethernet transceiver (fiber or copper) or other suitable modem may be employed (e.g., cable modem, DSL modem). In other embodiments, the expansion port may be coupled to a Wifi access point (IEEE 802.11 transceiver), WiMAX (IEEE 802.16), or mobile telephone cell site. The expansion port may be employed to establish a communication link 150 between the backhaul device 138 and devices at a residence, building, other structure, another fixed location, or between the backhaul device 138 and a mobile device.

Various sensor devices 115 also may be connected to the backhaul device 138 through the expansion port 146 or via other means (e.g., a dedicated sensor device interface not shown). Exemplary sensors that may form part of a power distribution parameter sensor device 116 and be coupled to the backhaul device 138 may include, a current sensor, voltage sensor, a level sensor (to determine pole tilt), a camera (e.g., for monitoring security, detecting motion, monitoring children's areas, monitoring a pet area), an audio input device (e.g., microphone for monitoring children, detecting noises), a vibration sensor, a motion sensor (e.g., an infrared motion sensor for security), a home security system, a smoke detector, a heat detector, a carbon monoxide detector, a natural gas detector, a thermometer, a barometer, a biohazard detector, a water or moisture sensor, a temperature sensor, and a light sensor. The expansion port may provide direct access to the core processor (which may form part of the controller 142) through a MII (Media Independent Interface), parallel, serial, or other connection. This direct processor interface may then be used to provide processing services and control to devices connected via the expansion port thereby allowing for a more less expensive device (e.g., sensor). The power parameter sensor device 115 may measure and/or detect one or more parameters, which, for example, may include power usage data, power line voltage data, power line current data, detection of a power outage, detection of water in a pad mount, detection of an open pad mount, detection of a street light failure, power delivered to a transformer data, power factor data (e.g., the phase angle between the voltage and current of a power line), power delivered to a downstream branch data, data of the harmonic components of a power signal, load transients data, and/or load distribution data. In addition, the backhaul device 138 may include multiple sensor devices 115 so that parameters of multiple power lines may be measured such as a separate parameter sensor device 116 on each of three MV power line conductors and a separate parameter sensor device on each of two energized LV power line conductors and one on each neutral conductor. One skilled in the art will appreciate that other types of utility data also may be gathered. As will be evident to those skilled in the art, the expansion port may be coupled to an interface for communicating with the interface 206 of the sensor device 116 via a non-conductive communication link.

The backhaul device 138 also may include a gigabit Ethernet (Gig-E) switch 148. Gigabit Ethernet is a term describing various technologies for implementing Ethernet networking at a nominal speed of one gigabit per second, as defined by the IEEE 802.3z and 802.3ab standards. There are a number of different physical layer standards for implementing gigabit Ethernet using optical fiber, twisted pair cable, or balanced copper cable. In 2002, the IEEE ratified a 10 Gigabit Ethernet standard which provides data rates at 10 gigabits per second. The 10 gigabit Ethernet standard encompasses seven different media types for LAN, MAN and WAN. Accordingly the gig-E switch may be rated at 1 gigabit per second (or greater as for a 10 gigabit Ethernet switch).

The switch 148 may be included in the same housing or co-located with the other components of the node (e.g., mounted at or near the same utility pole or transformer). The gig-E switch 148 maintains a table of which communication devices are connected to which switch 148 port (e.g., based on MAC address). When a communication device transmits a data packet, the switch receiving the packet determines the data packet's destination address and forwards the packet towards the destination device rather than to every device in a given network. This greatly increases the potential speed of the network because collisions are substantially reduced or eliminated, and multiple communications may occur simultaneously.

The gig-E switch 148 may include an upstream port for maintaining a communication link 152 with an upstream device (e.g., a backhaul node 132, an aggregation point 124, a distribution point 127), a downstream port for maintaining a communication link 152 with a downstream device (e.g., another backhaul node 134; an access node 134), and a local port for maintaining a communication link 154 to a Gig-E compatible device such as a mobile telephone cell cite 155 (i.e., base station), a wireless device (e.g., WiMAX (IEEE 802.16) transceiver), an access node 134, another backhaul node 132, or another device. In some embodiments the gig-E switch 148 may include additional ports.

In one embodiment, the link 154 may be connected to mobile telephone cell site configured to provide mobile telephone communications (digital or analog) and use the signal set and frequency bands suitable to communicate with mobile phones, PDAs, and other devices configured to communicate over a mobile telephone network. Mobile telephone cell sites, networks and mobile telephone communications of such mobile telephone cell sites, as used herein, are meant to include analog and digital cellular telephone cell sites, networks and communications, respectively, including, but not limited to AMPS, 1G, 2G, 3G, GSM (Global System for Mobile communications), PCS (Personal Communication Services) (sometimes referred to as digital cellular networks), 1× Evolution-Data Optimized (EVDO), and other cellular telephone cell sites and networks. One or more of these networks and cell sites may use various access technologies such as frequency division multiple access (FDMA), time division multiple access (TDMA), or code division multiple access (CDMA) (e.g., some of which may be used by 2G devices) and others may use CDMA2000 (based on 2G Code Division Multiple Access), WCDMA (UMTS)—Wideband Code Division Multiple Access, or TD-SCDMA (e.g., some of which may be used by 3G devices).

The gig-E switch 148 adds significant versatility to the backhaul device 138. For example, several backhaul devices may be coupled in a daisy chain topology (see FIG. 10), rather than by running a different fiber optic conductor to each backhaul node 134. Additionally, the local gig-E port allows a communication link 154 for connecting to high bandwidth devices (e.g., WiMAX (IEEE 802.16) or other wireless devices). The local gig-E port may maintain an Ethernet connection for communicating with various devices over optical fiber, coaxial cable or other wired medium. Exemplary devices may include user devices 130, a mobile telephone cell cite 155, and sensor devices (as described above with regard to the expansion port 146.

Communications may be input to the gig-E switch 148 from the MV interface 140, LV interface 144 or expansion port 146 through the controller 142. Communications also may be input from each of the upstream port, local port and downstream port. The gig-E switch 148 may be configured (by the controller 142 dynamically) to direct the input data from a given input port through the switch 148 to the upstream port, local port, or downstream port. An advantage of the gig-E switch 148 is that communications received at the upstream port or downstream port need not be provided (if so desired) to the controller 142. Specifically, communications received at the upstream port or downstream port may not be buffered or otherwise stored in the controller memory or processed by the controller. (Note, however, that communications received at the local port may be directed to the controller 142 for processing or for output over the MV interface 140, LV interface 144 or expansion port 146). The controller 142 controls the gig-E switch 148, allowing the switch 148 to pass data upstream and downstream (e.g. according to parameters (e.g., prioritization, rate limiting, etc.) provided by the controller). In particular, data may pass directly from the upstream port to the downstream port without the controller 142 receiving the data. Likewise, data may pass directly from the downstream port to the upstream port without the controller 142 receiving the data. Also, data may pass directly from the upstream port to the local port in a similar manner; or from the downstream port to the local port; or from the local port to the upstream port or downstream port. Moving such data through the controller 142 would significantly slow communications or require an ultra fast processor in the controller 142. Data from the controller 142 (originating from the controller 142 or received via the MV interface 140, the LV interface 144, or expansion port 146) may be supplied to the Gig-E switch 148 for communication upstream (or downstream) via the upstream port (or downstream port) according to the address of the data packet. Thus, data from the controller 142 may be multiplexed in (and routed/switched) along with other data communicated by the switch 148. As used herein, to route and routing is meant to include the functions performed by of any a router, switch, and bridge.

The backhaul device 138 also may include a controller 142 which controls the operation of the device 138 by executing program codes stored in memory. In addition, the program code may be executable to process the measured parameter data to, for example, convert the measured data to current, voltage, or power factor data. The backhaul 138 may also include a router, which routes data along an appropriate path. In this example embodiment, the controller 142 includes program code for performing routing (hereinafter to include switching and/or bridging). Thus, the controller 142 may maintain a table of which communication devices are connected to port in memory. The controller 142, of this embodiment, matches data packets with specific messages (e.g., control messages) and destinations, performs traffic control functions, performs usage tracking functions, authorizing functions, throughput control functions and similar related services. Communications entering the backhaul device 138 from the MV power lines 110 at the MV interface 140 are received, and then may be routed to the LV interface 144, expansion port 146 or gig-E switch 148. Communications entering the backhaul device 138 from the LV power lines 114 at the LV interface 144 are received, and may then be routed to the MV interface 140, the expansion port 146, or the gig-E switch 148. Communications entering the backhaul device 138 from the expansion port 146 are received, and may then be routed to the MV interface 140, the LV interface 144, or the gig-E switch 148. Accordingly, the controller 142 may receive data from the MV interface 140, LV interface 144 or the expansion port 146, and may route the received data to the MV interface 140, LV interface 144, the expansion port 146, or gig-E switch 148. In this example embodiment, user data may be routed based on the destination address of the packet (e.g., the IP destination address). Not all data packets, of course, are routed. Some packets received may not have a destination address for which the particular backhaul device 138 routes data packets. Additionally, some data packets may be addressed to the backhaul device 138. In such case the backhaul device may process the data as a control message.

Figure 8:
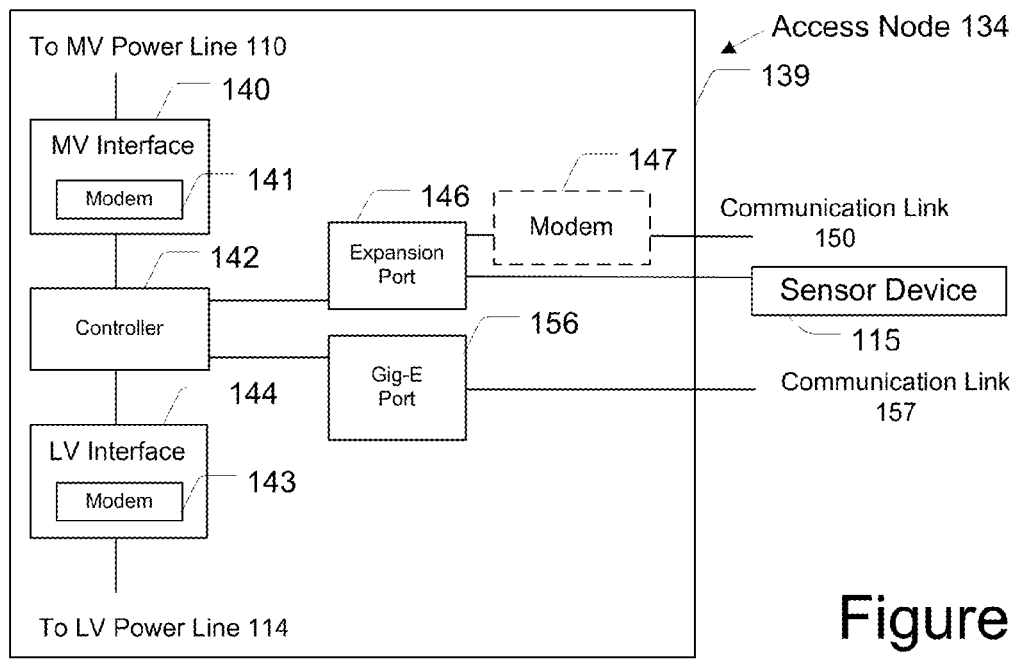
FIG. 8 is a block diagram of an example embodiment of an access node.
Figure 9:
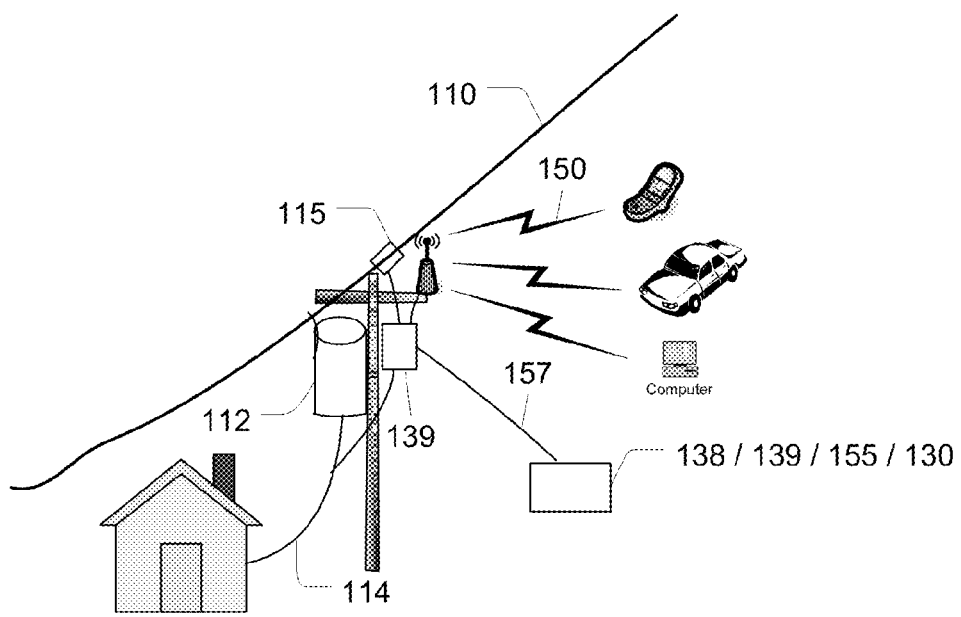
FIG. 9 illustrates an implementation of an example embodiment of an access node.

Access Device 139:

The backhaul nodes 132 may communicate with user devices via one or more access nodes 134, which may include an access device 139. FIGS. 8-9 show an example embodiment of such an access device 139 for providing communication services to mobile devices and to user devices at a residence, building, and other locations. Although FIG. 9 shows the access node 134 coupled to an overhead power line, in other embodiments an access node 134 (and its associated sensor devices 115) may be coupled to an underground power line.

In one example embodiment, access nodes 124 provide communication services for user devices 130 such as security management; IP network protocol (IP) packet routing; data filtering; access control; service level monitoring; service level management; signal processing; and modulation/demodulation of signals transmitted over the communication medium.

The access device 139 of this example node 134 may include a bypass device that moves data between an MV power line 110 and an LV power line 114. The access device 139 may include a medium voltage power line interface (MV Interface) 140 having a MV modem 141, a controller 142, a low voltage power line interface (LV interface) 144 having a LV modem 143, and an expansion port 146, which may have the functionality, functional components (and for connecting to devices, such as power line parameter sensor device 115) as previously described above with regard of the backhaul device 138. The access device 139 also may include a gigabit Ethernet (gig-E) port 156. The gig-E port 156 maintains a connection using a gigabit Ethernet protocol as described above for the gig-E switch 146 of FIG. 6. The power parameter sensor device 116 may be connected to the access device 139 to measure and/or detect one or more parameters of the MV power or the LV power line, which, for example, may include power usage data, power line voltage data, power line current data, detection of a power outage, detection of water in a pad mount, detection of an open pad mount, detection of a street light failure, power delivered to a transformer data, power factor data (e.g., the phase angle between the voltage and current of a power line), power delivered to a downstream branch data, data of the harmonic components of a power signal, load transients data, and/or load distribution data. In addition, the access device 134 may include multiple sensor devices 116 so that parameters of multiple power lines may be measured such as a separate parameter sensor device 116 on each of three MV power line conductors and a separate parameter sensor device on each of two energized LV power line conductors and one on each neutral conductor. One skilled in the art will appreciate that other types of utility data also may be gathered. The sensor devices 115 described herein may be co-located with the power line communication device with which the sensor device 115 communicates or may be displaced from such device (e.g., at the next utility pole or transformer).

The Gig-E port 156 may maintain an Ethernet connection for communicating with various devices over optical fiber, coaxial cable or other wired medium. For example, a communication link 157 may be maintained between the access device 139 and another device through the gig-E port 156. For example, the gig-E port 156 may provide a connection to user devices 130, sensor devices (as described above with regard to the expansion port 146, such as to power line parameter sensor device 115), or a cell station 155.

Communications may be received at the access device 139 through the MV interface 140, LV interface 144, expansion port 146 or gig-E port 156. Communications may enter the access device 139 from the MV power lines 110 through the MV interface 140, and then may be routed to the LV interface 142, expansion port 146 or gig-E port 156. Communications may enter the access device 139 from the LV power lines 114 through the LV interface 144, and then may be routed to the MV interface 140, the expansion port 146, or the gig-E port 156. Communications may enter the access device 139 from the expansion port 146, and then may routed to the MV interface 140, the LV interface 144, or the gig-E port 156. Communications may enter the access device 139 via the gig-E port 156, and then may be routed to the MV interface 140, the LV interface 144, or the expansion port 146. The controller 142 controls communications through the access device 139. Accordingly, the access device 139 receives data from the MV interface 140, LV interface 144, the expansion port 146, or the gig-E port 156 and may route the data to the MV interface 140, LV interface 144, expansion port 146, or gig-E port 156 under the direction of the controller 142. In one example embodiment, the access node 134 may be coupled to a backhaul node 132 via a wired medium coupled to Gig-E port 156 while in another embodiment, the access node is coupled to the backhaul node 132 via an MV power line (via MV interface 140). In yet another embodiment, the access node 134 may be coupled to a backhaul node 132 via a wireless link (via expansion port 146 or Gig-E port 156). In addition, the controller may include program code that is executable to control the operation of the device 139 and to process the measured parameter data to, for example, convert the measured data to current, voltage, or power factor data.

Other Devices:

Another communication device is a repeater (e.g., indoor, outdoor, low voltage (LVR) and/or medium voltage) which may form part of a repeater node 135 (see FIG. 1). A repeater serves to extend the communication range of other communication elements (e.g., access devices, backhaul devices, and other nodes). The repeater may be coupled to power lines (e.g., MV power line; LV power line) and other communication media (e.g., fiber optical cable, coaxial cable, T-1 line or wireless medium). Note that in some embodiments, a repeater node 135 may also include a device for providing communications to a user device 130 (and thus also serve as an access node 134).

In various embodiments a user device 130 is coupled to an access node 134 using a modem. For a power line medium, a power line modem 136 is used. For a wireless medium, a wireless modem is used. For a coaxial cable, a cable modem is may be used. For a twisted pair, a DSL modem may be used. The specific type of modem depends on the type of medium linking the access node 134 and user device 130.

In addition, the PLCS may include intelligent power meters, which, in addition to measuring power usage, may include a parameter sensor device 115 and also have communication capabilities (a controller coupled to a modem coupled to the LV power line) for communicating the measured parameter data to the access node 134. Detailed descriptions of some examples of such power meter modules are provided in U.S. patent application Ser. No. 11/341,646, filed on Jan. 30, 2006 entitled, "Power Line Communications Module and Method," which is hereby incorporated herein by reference in it entirety.

A power line modem 136 couples a communication onto or off of an LV power line 114. A power line modem 136 is coupled on one side to the LV power line. On the other side, the power line modem 136 includes a connector to connect to a wired or wireless medium leading to the user device 130. One protocol for communicating with access nodes 132 over an LV power line is the HomePlug 1.0 standard of the HomePlug® Alliance for routing communications over low voltage power lines. In this manner, a customer can connect a variety of user devices 130 to the communication network 104.

The parameter sensor devices 115 and applications for using the related data also be incorporated in power line communication systems that communicate over underground power lines. Detailed descriptions of the components, features, and power line communication devices of some example underground PLCS are provided in U.S. patent application Ser. No. 11/399,529, filed on Apr. 7, 2006, issued as U.S. Pat. No. 7,450,000, entitled, "Power Line Communications Device and Method," which is hereby incorporated herein by reference in its entirety. The parameter sensor devices 115 described herein (or portions thereof) may be formed in or integrated with couplers for coupling communication signals to and from the power lines. For example, the Rogowski coils described above may be attached to the transformer side of the coupler (or integrated into the coupler) that couples to the underground (or overhead) MV power lines to allow installation of the coupler to also accomplish installation of the sensor device 115.

Network Communication Protocols:

The communication network 104 may provide high speed internet access and other high data-rate data services to user devices, homes, buildings and other structure, and to each room, office, apartment, or other unit or sub-unit of multi-unit structure. In doing so, a communication link is formed between two communication nodes 128 over a communication medium. Some links are formed by using a portion 101 of the power system infrastructure. Specifically, some links are formed over MV power lines 110, and other links are formed over LV power lines 114. Still other links may be formed over another communication media, (e.g., a coaxial cable, a T-1 line, a fiber optic cable, wirelessly (e.g., IEEE 802.11a/b/g, 802.16, 1G, 2G, 3G, or satellite such as WildBlue®)). Some links may comprise wired Ethernet, multipoint microwave distribution system (MMDS) standards, DOCSIS (Data Over Cable System Interface Specification) signal standards or another suitable communication method. The wireless links may also use any suitable frequency band. In one example, frequency bands are used that are selected from among ranges of licensed frequency bands (e.g., 6 GHz, 11 GHz, 18 GHz, 23 GHz, 24 GHz, 28 GHz, or 38 GHz band) and unlicensed frequency bands (e.g., 900 MHz, 2.4 GHz, 5.8 GHz, 24 GHz, 38 GHz, or 60 GHz (i.e., 57-64 GHz)).

Accordingly, the communication network 104 includes links that may be formed by power lines, non-power line wired media, and wireless media. The links may occur at any point along a communication path between a backhaul node 132 and a user device 130, or between a backhaul node 132 and a distribution point 127 or aggregation point 124.

Communication among nodes 128 may occur using a variety of protocols and media. In one example, the nodes 128 may use time division multiplexing and implement one or more layers of the 7 layer open systems interconnection (OSI) model. For example, at the layer 3 'network' level, the devices and software may implement switching and routing technologies, and create logical paths, known as virtual circuits, for transmitting data from node to node. Similarly, error handling, congestion control and packet sequencing can be performed at Layer 3. In one example embodiment, Layer 2 'data link' activities include encoding and decoding data packets and handling errors of the 'physical' layer 1, along with flow control and frame synchronization. The configuration of the various communication nodes may vary. For example, the nodes coupled to power lines may include a modem that is substantially compatible with the HomePlug 1.0 or A/V standard. In various embodiments, the communications among nodes may be time division multiple access or frequency division multiple access.

Software:

The communication network 104 may be monitored and controlled via a power line server that may be remote from the structure and physical location of the network elements. The controller of the nodes 128 describe herein may include executable program code for controlling the operation of the nodes and responding to commands. The PLS may transmit any number of commands to a backhaul nodes 132 and access nodes 134 to manage the system. As will be evident to those skilled in the art, most of these commands are equally applicable for backhaul nodes 132 and access nodes 134. For ease of discussion, the description of the commands will be in the context of a node 128 (meant to include both). These commands may include altering configuration information, synchronizing the time of the node 128 with that of the PLS, controlling measurement intervals (e.g., voltage measurements), requesting measurement or data statistics, requesting the status of user device activations, rate shaping, and requesting reset or other system-level commands. Any or all of these commands may require a unique response from the node 128, which may be transmitted by the node 128 and received and stored by the PLS. The PLS may include software to transmit a command to any or all of the nodes (134 and 132) to schedule a voltage and/or current measurement at any particular time so that all of the network elements of the PLCS take the measurement(s) at the same time.

Alerts

In addition to commands and responses, the node 128 has the ability to send Alerts and Alarms to the PLS. Alerts typically are either warnings or informational messages transmitted to the PLS in light of events detected or measured by the node 128. Alarms typically are error conditions detected.

One example of an Alarm is an Out-of-Limit Alarm that indicates that an out-of-limit condition has been detected at the node 128, which may indicate a power outage on the LV power line, an MV or LV voltage too high, an MV or LV voltage too low, a temperature measurement inside the node 128 is too high, and/or other out-of-limit conditions. Information of the Out-of-Limit condition, such as the type of condition (e.g., a LV voltage measurement, a node 128 temperature), the Out-of-Limit threshold exceeded, the time of detection, the amount (e.g., over, under, etc.) the out of limit threshold has been exceeded, is stored in the memory of the node 128 and transmitted with the alert or transmitted in response to a request from the PLS.

Software Upgrade Handler

The Software Upgrade Handler software may be started by the node 128 Command Processing software in response to a PLS command. Information needed to download the upgrade file, including for example the remote file name and PLS IP address, may be included in the parameters passed to the Software Command Handler within the PLS command.

Upon startup, the Software Command Handler task may open a file transfer program such as Trivial File Transfer Protocol (TFTP) to provide a connection to the PLS and request the file. The requested file may then be downloaded to the node 128. For example, the PLS may transmit the upgrade through the Internet to the node 128 (and perhaps through the backhaul node, and over the MV power line) where the upgrade may be stored in a local RAM buffer and validated (e.g., error checked) while the node 128 continues to operate (i.e., continues to communicate packets). Finally, the task copies the downloaded software into a backup boot page in non-volatile memory, and transmits an Alert indicating successful installation to the PLS. The node 128 then makes the downloaded software the primary boot page and reboots. When the device restarts the downloaded software will be copied to RAM and executed. The device will then notify the PLS that it has rebooted via an alert indicating such. In addition, and through substantially the same procedure, new software code may be received by the controller for storage in (e.g., to replace existing code) and execution at the media access control (MAC) layer of the LV modem and/or the MV modem of the access device or the backhaul device.

ADC Scheduler

Any of the nodes described herein may include an analog to digital converter (ADC) for measuring the voltage, current, and/or other parameters of any power line 110,114. The ADC may be located within the power line parameter sensor device 115 or within the power line communication device 138,139, 135. The ADC Scheduler software, in conjunction with the real-time operating system, creates ADC scheduler tasks to perform ADC sampling according to configurable periods for each sample type. Each sample type corresponds with an ADC channel. The ADC Scheduler software creates a scheduling table in memory with entries for each sampling channel according to default configurations or commands received from the PLS. The table contains timer intervals for the next sample for each ADC channel, which are monitored by the ADC scheduler.

ADC Measurement Software

The ADC Measurement Software, in conjunction with the real-time operating system, creates ADC measurement tasks that are responsible for monitoring and measuring data accessible through the ADC 330 such as the power distribution parameter sensor devices 115 (including the current sensor devices 115 and voltage sensor devices) described herein. Each separate measurable parameter may have an ADC measurement task. Each ADC measurement task may have configurable rates for processing, recording, and reporting for example.

An ADC measurement task may wait on a timer (set by the ADC scheduler). When the timer expires the task may retrieve all new ADC samples for that measurement type from the sample buffer, which may be one or more samples. The raw samples are converted into a measurement value. The measurement is given the timestamp of the last ADC sample used to make the measurement. The measurement may require further processing. If the measurement (or processed measurement) exceeds limit values, an alert condition may be generated. Out of limit Alerts may be transmitted to the PLS and repeated at the report rate until the measurement is back within limits. An out of limit recovery Alert may be generated (and transmitted to the PLS) when the out of limit condition is cleared (i.e., the measured value falls back within limit conditions).

The measurements performed by the ADC, each of which has a corresponding ADC measurement task, may include node 128 inside temperature, LV power line voltage, LV power line current, MV power line voltage, and/or MV power line current for example. MV and LV power line measurements may be accomplished via the power line parameter sensor devices 115.

As discussed, the nodes may include value limits for most of these measurements stored in memory with which the measured value may be compared. If a measurement is below a lower limit, or above an upper limit (or otherwise out of an acceptable range), the node 128 may transmit an Out-of-Limit Alert. Such alert may be received and stored by the PLS. In some instances, one or more measured values are processed to convert the measured value(s) to a standard or more conventional data value.

The LV power line voltage measurement may be used to provide various information. For example, the measurement may be used to determine a power outage (and subsequently a restoration), or measure the power used by a consumer (when current data is also available) or by all of the consumers connected to that distribution transformer. In addition, it may be used to determine the power quality of the LV power line by measuring and processing the measured values over time to provide frequency, harmonic content, and other power line quality characteristics.

A more extensive listing of exemplary uses of the measured power line parameter data is provided below.

Figure 10:
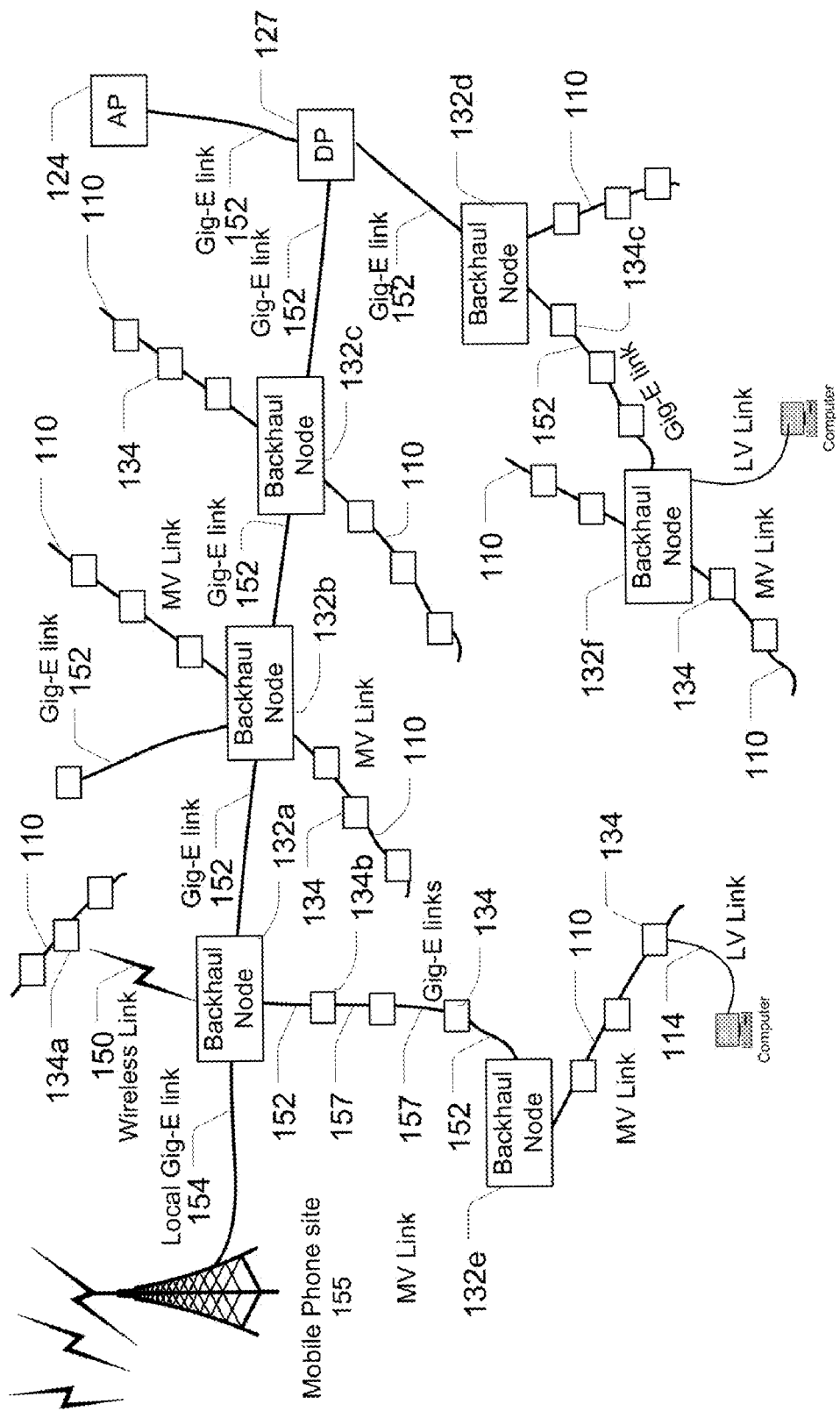
FIG. 10 is a partial network diagram showing an example topology of a power line communication and power distribution parameter system according to an example embodiment of the present invention.

Network Topology:

FIG. 10 shows an example embodiment of a network topology which illustrates many of the communication features of the backhaul node 132 and access node 134. For example, several backhaul nodes 132a-c may be coupled together in a daisy chain configuration by communication links 152. Such links 152 may be formed by the upstream and downstream ports of the gig-E switch 148 of the respective backhaul nodes 132. The gig-E switch 148 also may be implemented to connect a backhaul node 132c to a distribution point 127. Accordingly, the gig-E switch 148 may form part of a communication link along a path for communicating with an internet protocol network 126. Further, a local port of a gig-E switch 148 may be implemented to couple a backhaul node 132a to a mobile phone site 155 via link 154. The backhaul nodes 132a-d also may be coupled to MV power lines 110 to maintain MV links for communication with multiple access nodes 134 (shown as small rectangles). The backhaul node 132a may also be coupled to an access node 134a (which may repeat data for other access nodes 134) over a wireless communication link 150, for example, through the expansion port 146. The backhaul node 132a is further illustrated to couple to a chain of access devices 134 and a backhaul node 132e. The link from the backhaul node 132a to the access node 134b may be formed by coupling a downstream port of the gig-e switch 148 of backhaul node 132a to the gig-E port 156 of the access node 134b. A similar link is shown between the backhaul node 132d and the access node 134c. Still another communication link is shown over an LV power line 114 to couple an access node 134d to a computer and to couple a backhaul node 132f to computer via a LV power line 114.

Methods of Detecting Distribution Transformer Overload

According to various embodiments of the present invention, power distribution parameter sensor devices 115 and power line communication devices (PLCD) 138, 139, 135 may be used to identify distribution transformers 112 that experience intermittent or frequent overload conditions. A distribution transformer 112 experiences an overload condition when the power being drawn through the transformer to supply power to customer premises exceeds a rated power load for such transformer. To detect an overload condition the power input to the transformer or power output from the transformer is measured. In one embodiment the load of a given distribution transformer at a given time is determined by measuring the transformer's output current and comparing that measured current to a rated current for the distribution transformer. In another embodiment, the load of a given distribution transformer may be derived by gathering power usage data from the power meters at all of the premises served by the distribution transformer. For example, a comparison of the obtained power usage data from a given meter over a given time provides a measure of the power load drawn by the premises associated with the given meter. Taking the sum of measures for corresponding time periods at all of the power meters served by the given distribution transformer provides a measure of the power load over the given time period for the transformer. According to either embodiment a measure of power load at a given distribution transformer may be obtained. Such measure may be compared to a rated power load for the given transformer to identify a power overload condition.

Figure 11A:
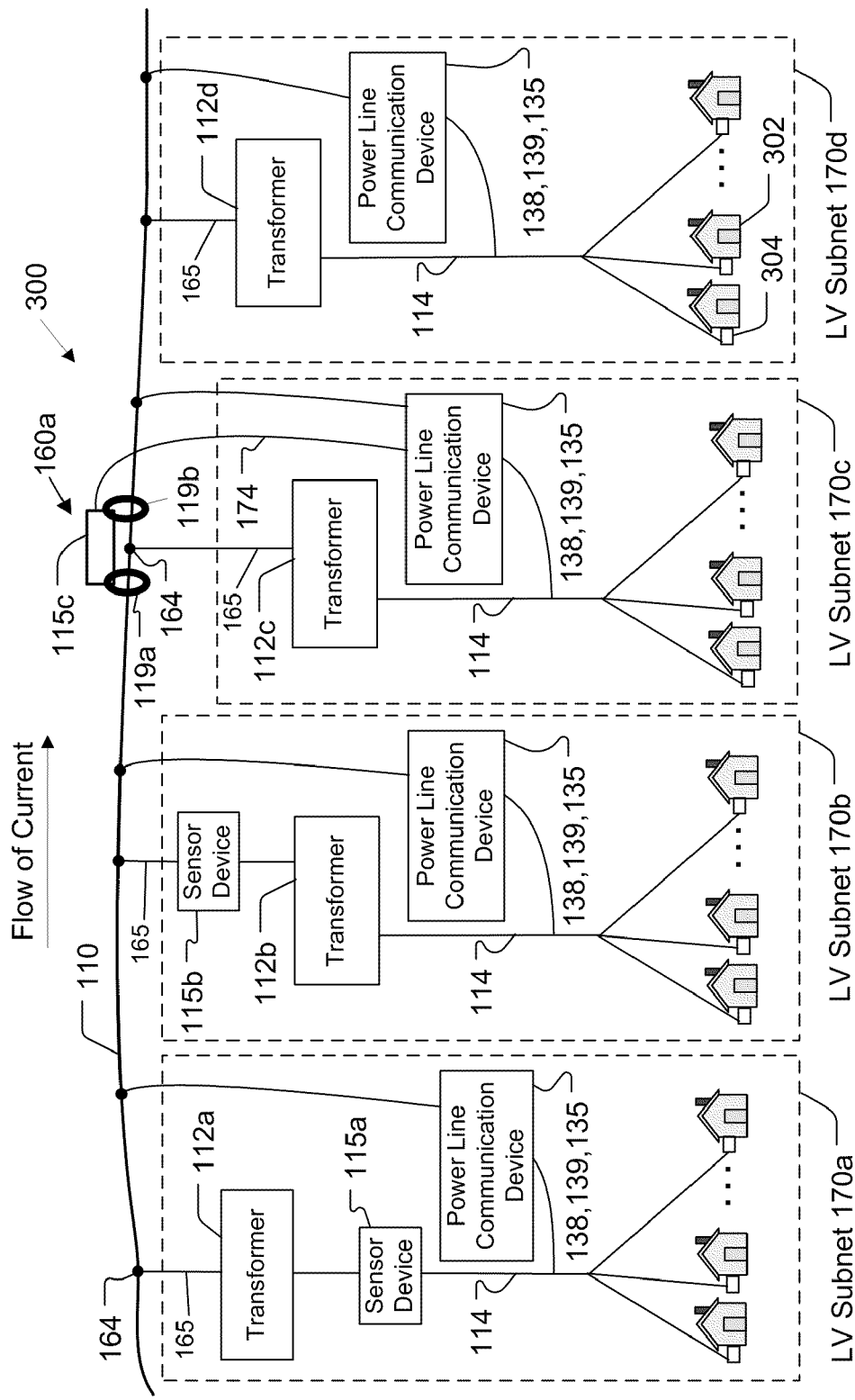
FIGS. 11a-c are schematic representations of various example configurations for detecting power transformer overload according to example embodiments of the present invention.

FIG. 11a illustrates a portion 300 of a power line communication and distribution system with various low voltage (LV) subnets 170a-d which depict various example configurations for practicing the present invention. Each LV subnet 170 may include a distribution transformer 112 and one or more LV power lines 114, and serve one or more homes, offices, building or other power customer structures. Power is supplied to each LV subnet 170 via the distribution transformer 112 that receives power from a MV power line 110. A distribution transformer 112, coupled to the MV power line 110, steps down the MV voltage to low voltage for distribution to the customer structures. A power line communication device 138, 139, 135 may be located in the vicinity of a distribution transformer 112 and manage power line communications for the transformer's associated LV subnet 170. In various embodiments, a power distribution parameter sensor device 115 may be installed on each LV subnet 170 to measure parameters (e.g., power) to detect distribution transformer overload and other power line distribution parameters.

According to one configuration for practicing an embodiment of the present invention, the LV subnet 170a may include one or more sensor devices 115a installed on an LV power line 114 in the vicinity of a distribution transformer 112a. For example, a current sensor device 116 may be installed to measure the current supplied by the distribution transformer 112a. In some embodiments the power distribution parameter device 115a also may measure voltage. As will be discussed in more detail below, the measured power being supplied by the distribution transformer 112 may be periodically compared to the rating output of the transformer (by a local or a remote device) to determine whether a transformer overload condition exists.

According to another configuration for practicing the present invention, the LV subnet 170b may include a power distribution parameter sensor device 115b installed on the conductor 165 that connects to the distribution transformer 112b to the MV power line 110. For example, a current sensor device 116 may be installed and measure the current entering the distribution transformer 112b. By knowing the current into the transformer, the current output from the distribution transformer 112 can be calculated (based on the turns ration of the transformer 112), which can then be used (along with measured or estimated voltages from the LV or MV power line) to determine the power output of transformer 112. The output power of the distribution transformer 112 may be periodically compared to the rating output of the transformer (by a local or a remote device) to determine whether a transformer overload condition exists.

According to still another configuration for practicing the present invention, the LV subnet 170c may include a power distribution parameter sensor device 115c installed on the MV power line 110, and be embodied as a dual sensor assembly 160. The assembly 160 may include a pair of current sensors 119 coupled together (e.g., mechanically). Each current sensor 119a,b of the pair may be installed on opposite sides of the connection point 164. The current sensors 119 may share a common communication interface for communication with a corresponding power line communication device (e.g., a backhaul device 138, an access device 139, or a repeater 135). In one embodiment, the dual sensor device assembly 160 may be coupled to the power line communication device 138, 139, 135 by a fiber optic conductor 174. In other embodiments, communications with the power line communication device may occur over a wireless communication path.

As shown in FIG. 11a, the flow of current is from left to right over the MV power line 110. Thus, current sensor 119a measures the current on the MV power line 110 before the connection point 164. Current sensor 119b measures the current on the MV power line 110 after the connection point 164. By computing the difference of the measured current data between the two current sensors 119a,b (the measurement from sensor 119a minus the measurement from sensor 119b), the current carried through conductor 165 and supplied to the transformer 112*a* may be determined. Such computation may be performed by the sensor assembly 160, at the local device 138, 138, 139, or at a remote computer system.

Figure 11B:
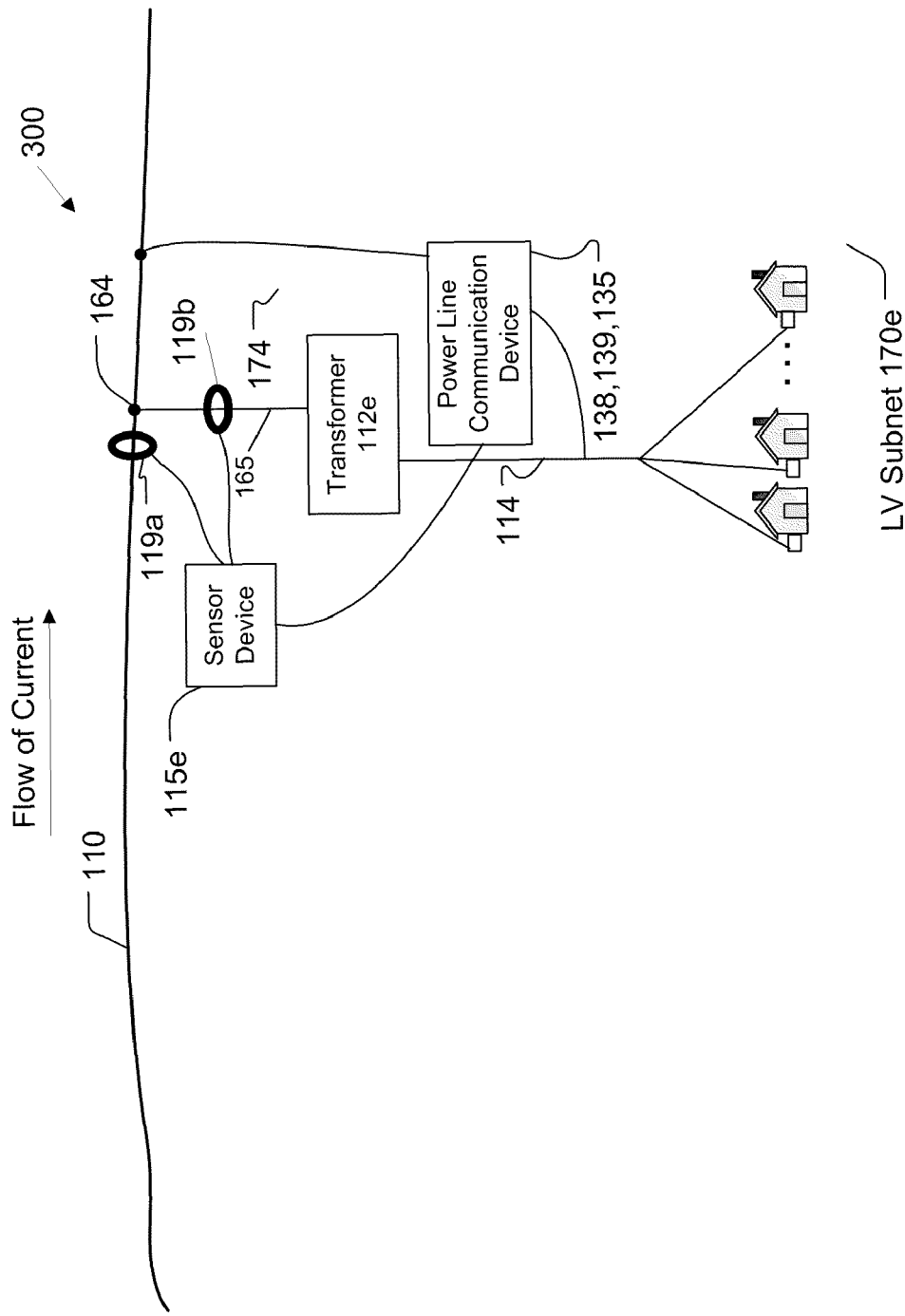

An alternate configuration of an LV subnet 170*e* is illustrated in FIG. 11*b* wherein current sensor 119*b* is installed on the tap conductor 165 (the conductor that connects the transformer to the MV power line 110) while the other sensor 119*a* remains on the MV power line 110. Both sensors 119*a* and 119*b* may share common electronics disposed in the sensor device housing to process measurements, power the sensors 119 (if necessary), and communicate with PLCD. Using this configuration, the sensor device 115*a* can measure the current into the transformer 112 (via the sensor 119*b* coupled to the tap conductor 164) and also measure the current carried by the MV power line 110 directly before the tap connection 164. In yet another embodiment, sensor 119*a* may be installed after the tap connection 164 to measure the current after the tap while sensor 119*b* is installed on the tap conductor 165. As discussed elsewhere herein, data of the measured currents can be transmitted and/or used for various purposes such as, for example, to determine whether the MV power line 110 is approaching (or is over) maximum capacity.

Figure 11C:
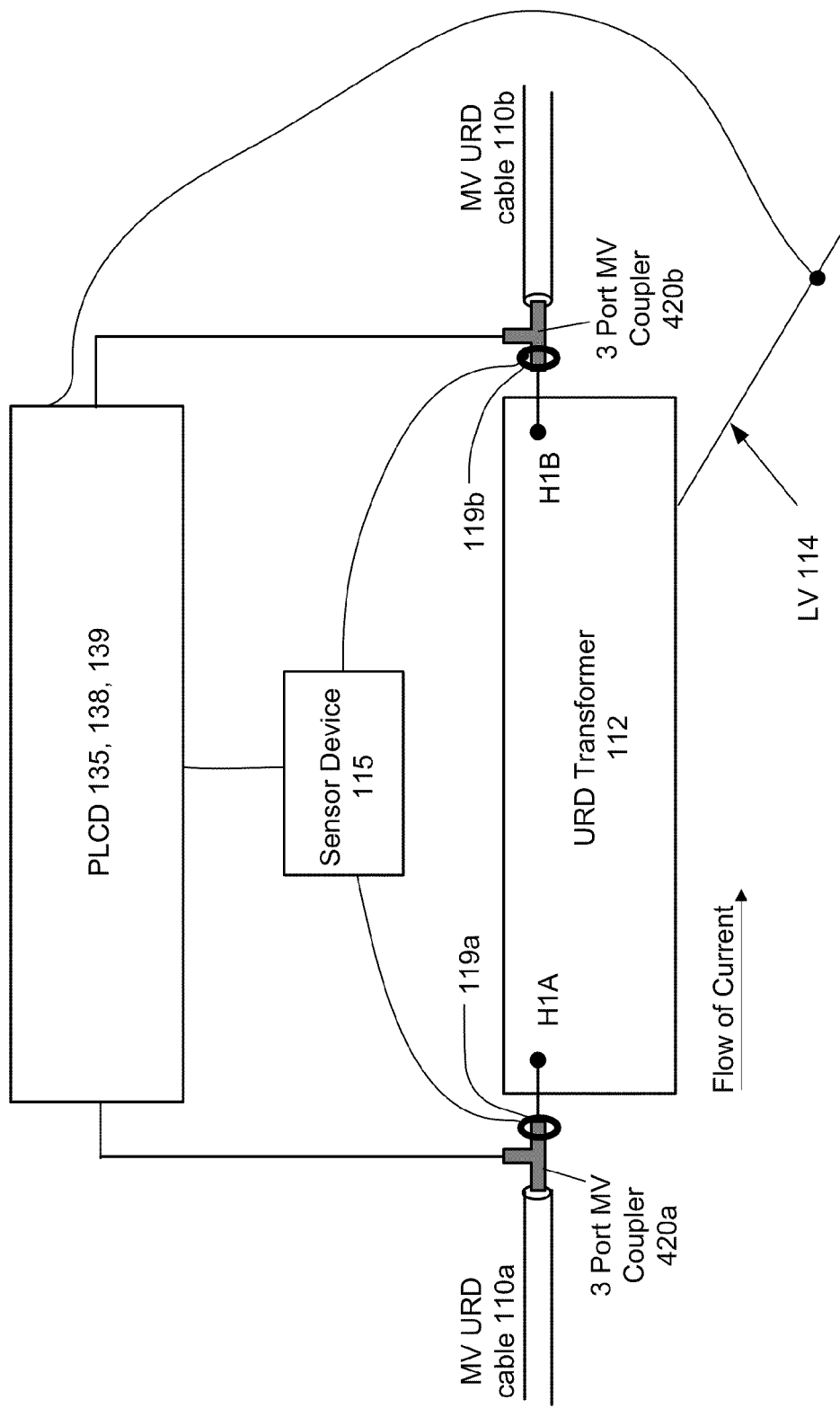

FIG. 11*c* illustrates another example configuration for use with underground residential distribution (URD) transformers. As illustrated, URD transformers 112 are configured differently from overhead transformers as there is no tap conductor connecting the MV power line 110 to the transformer 112. More specifically, the URD cable is connected to two terminals (H1A and H1B) of the transformer and the current flows "through" the transformer as shown. In this embodiment, the PLCD is a three port device that is connected to the upstream MV power line segment 110*a* (which may be connected to an upstream transformer) via coupler 420*a*, the downstream MV power line segment 110*b* (which may be connected to a downstream transformer) via coupler 420*b*, and to the LV power line 114 for communication with devices in one or more customer premises. In this embodiment sensor 119*a* is coupled to upstream MV power line segment 110*a* and sensor 119*b* is coupled to the downstream MV power segment 110*b*. Similar to other configurations described herein, measuring the current before (sensor 119*a*) and after (sensor 11*b*) the transformer 112 allows one to determine the current provided to the transformer 112 to thereby detect an overload condition. Both sensors 119 are connected to the sensor device 115, which itself is connected to the PLCD. It is worth noting that URD power lines are insulated power lines and the sensors 119 (which may include, for example, a Rogowski coil or other sensor) may be disposed around (external to) the insulation of the power line at a location where the external neutral of the power line has been removed or pealed away. In this embodiment, the current sensors 119 may be integrated with or mounted beside (and be separate from) the couplers 420. While the sensors 119 are shown on the transformer side of the couplers 420, they could be mounted on the opposite side of the couplers as well. While the sensor device 115 is shown separately from the PLCD, this configuration may be more suitable for combining the sensor device 115 and its circuitry with (e.g., in the same housing) as the PLCD circuitry. This is because there is no need to isolate the sensor device 115 from the PLCD, because the sensor device 115 is not exposed to MV voltages (because the MV URD cable is insulated).

For each of the configurations, a voltage sensor device also may be installed to measure power line voltage. Such voltage sensor device may be located in the vicinity of (or integrated with) the current sensor device 116 of the sensor device 115 (e.g., if it is feasible to measure the MV voltage). In one example embodiment, a voltage sensor is connected to the LV power line. Depending on the embodiment a single voltage sensor may be connected to either energized conductor or a multiple voltage sensors may be configured to measure the voltage of each energized LV conductor (typically two or three). The voltage sensors may be physically disposed within the housing of the PLCD (or a separate housing) and be connected to the LV power line 114 through the one or more conductor leads that connect the PLCD 138, 139, 135 to the LV power line for receiving power and for communicating over the LV power line. By knowing the LV voltage, the MV voltage may be computed based on the turns ratio of the transformer 112.

In other embodiments the voltage sensor device may be more remote. Voltage along the MV power line may be assumed to be generally the same across a given MV section or may be estimated at various transformer 112 based on measurements at a MV substation. Accordingly, a voltage sensor device may not be necessary at the parameter sensor device 115 in all embodiments and in some embodiments may be remote (e.g., such as on the MV power line, at the MV substation). In some embodiments, voltage data (whether estimated or derived from such voltage sensor device), may be associated with measurements of the power line current obtained from the various sensor devices 115*b,c* located in the vicinity of each respective transformer 112. The power line voltage and associated power line current may be used to calculate or estimate an equivalent load for the power supplied by each transformer 112*b,c*.

According to yet another configuration for practicing the present invention illustrated in FIG. 11*a*, the LV subnet 170*d* may not require a power distribution parameter sensor device 115. LV subnet 170*d* includes a transformer 112*d* coupled to the MV power line by conductor 165 and serving one or more customer premises 302. Each of the premises 302 may include a power utility meter 304 capable of communicating with the PLCD 138, 139, 135 (or other device) located in the vicinity of the transformer 112*d* or elsewhere. For this configuration, an overload condition of the distribution transformer 112*d* may be detected without a power distribution parameter sensor device 115. To detect an overload condition, the power being provided to each of the premises 302 served by the distribution transformer 112*d* may be determined from the measurements taken by each meter 304. The data from each meter may be combined (summed) to determine the power supplied by the transformer 112*d*. In particular, by obtaining power usage data from each of the meters 304 over a generally concurrent time period, (e.g., between a first time and a subsequent second time), the average power load on the transformer 112*d* may be derived for such time period. For example, the PLCD may obtain power usage data from each power utility meter 304 every five minutes, 15 minutes, or other time period although the specific time period may vary. In addition, the meters may be configured to measure the instantaneous power being supplied to the customer premises—either periodically or in response to a command received via the PLCD or other communication device. Various embodiments of such a meter module for communicating meter data are described in U.S. patent application Ser. No. 11/341,646, filed Jan. 30, 2006, entitled Power Line Communications Module and Method, which is hereby incorporated by reference in its entirety.

In still other configurations, a LV subnet 170 may include sensor devices at various locations within the LV subnet, such as at both the MV side and LV side of the distribution transformer 112, or along multiple LV power line segments which are connected to the distribution transformer 112. For each of the LV subnets 170a-e, power line current, power line voltage, and/or power usage data may be sampled at regular times, periodically, aperiodically, at one or more scheduled times, or in response to specific commands or triggering events. Power distribution parameters may be measured independently and gathered at each PLCD, or be measured concurrently, such as from multiple power meters or sensor devices—or for all sensor devices 115 in a LV subnet 170 or network 300. For example, utility meter data or sensor device data from a building, neighborhood, a city, a country, or other region may be measured. Alternately, utility meter data or sensor device data for the entire power line distribution system 104 may be collected. Such samples may be stored in memory at the PLCD for subsequent processing and/or transmission. For example, the PLCD may periodically test the sensor device data, or the accumulated power usage data, to determine whether an exception condition exists (e.g., overload). Alternatively or in addition, the obtained data may be transmitted to a remote center, such as the power line server 118 for processing. Similarly, the results of processing may be transmitted to the PLS 118.

Various methods may be practiced to detect, report and respond to overload conditions. In some embodiments, a PLCD may obtain utility meter data or sensor device data, and process the data to identify a distribution transformer overload condition. The utility meter data, sensor device data and/or processing results may be communicated to the PLS 118 or other processing system. In other embodiments, the PLCD (or other device) obtains the utility meter data or sensor device data, performs some processing, and transmits less than all data samples or results to the PLS 118. In still other embodiments, the PLCD (or other device) merely gathers the utility meter data or sensor device data and the PLS processes the data to determine whether an overload condition exists. At the PLS 118, raw data may be received, stored and processed. In some embodiments results of PLCD processing also may be received and stored, and in some cases further processed. The PLS 118 may perform processing on the most recent data in near real time. The PLS may perform processing on a time series of data to obtain current, recent and/or historical information. In some embodiments, different modes of operation may be implemented at different times or for different areas. At certain times, a given PLCD may operate to provide exception reporting, periodic reporting, aperiodic reporting, and/or prompted reporting (e.g., report generated in response to a specific command from the PLS).

Figure 12:
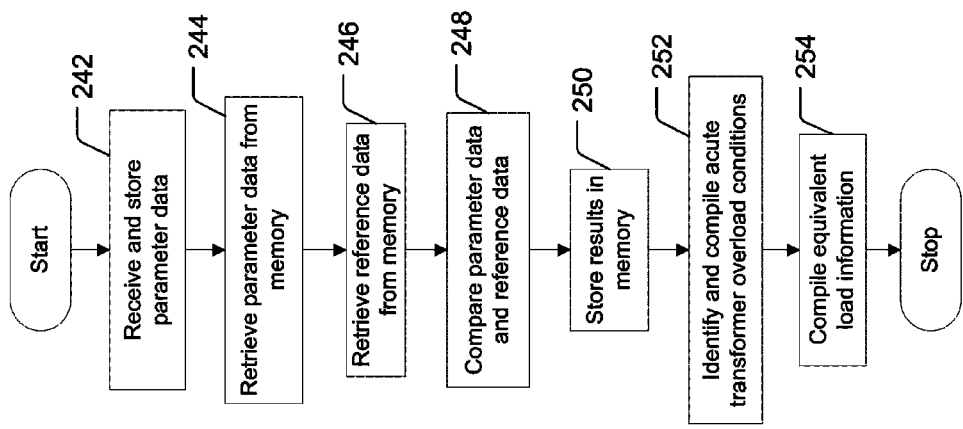
FIG. 12 is a flow chart of a process for detecting distribution transformer overload according to a sample embodiment of the present invention.

FIG. 12 is a flow chart of an implementation for detecting distribution transformer overload according to an example embodiment of the present invention. The processes included in the implementation may be performed at either one or the other of the PLCD and PLS 118. At step 242 the power distribution parameter data (e.g., power line parameter sensor device 115 data and/or aggregated utility meter 304 power usage data) is received and stored in memory. At step 244 the parameter data is retrieved from memory for processing. At step 246, corresponding reference data (e.g. data of the rated value of transformer load or current) are retrieved from memory. In particular each transformer 112 may have a nameplate rating of current or load. Such reference value may be stored in memory (e.g., at the PLCD; at the PLS 118) and associated with the appropriate transformer 112 (e.g., based on the transformer model). Different ratings may apply for different transformers 112 according to the model (e.g., based on size and number of windings). At step 248 the data may be compared to the reference data. The result of the comparison indicates whether the power supplied by the transformer (the parameter data) exceeds the reference data (e.g., the transformer rating). In addition or alternatively, a relative value may be obtained, such as a ratio or percentage of the data to the reference value. For the case where the data is power line current, the result may be an indication that the rated current is exceeded and that the current is 110% of the rated current. For the case where power usage data is received, power current or power load may be derived from the power usage data.

In embodiments where multiple sensor devices 115 provide data for a given LV subnet 170 (e.g., power line voltage and power line current), the device data may be combined to calculate an equivalent power supplied by the corresponding transformer 112. In such case, the power may be compared at step 248 to a rated equivalent load for transformer 112b. In other embodiments, an LV power line voltage may be estimated rather than measured and combined with the measured power line current to derive an estimate of the equivalent load.

At step 250 the comparison results achieved at step 248 may be stored in memory. The steps 242-250 may be repeated for all the measurement data. As an alternate step (not shown), the implementation may determine whether an overload alert condition exists. At step 252 the results may be compiled to provide an acute transformer overload report, which alerts an operator about transformers loads that exceed a rating by a user configurable percentage (and in some instances, where that overload condition exists for a threshold duration). As an example, generation of such a report at the PLS 118 may alert an operator of all transformers 112 that are operating at 120% or more of their rated load (and in some embodiments, where the overload existed for at least one hour). Such report may be generated based upon the most recent data, (e.g., a nearly real time report) or upon data from some recent or historical time period. In some embodiments, at step 254 the results may be compiled to generate a load report. For example, a transformer load report may be generated to identify the equivalent load of all distribution transformers for an area of Interest for a set period of time. Such reports also may be derived by a PLCD for the PLCD's corresponding transformer and be communicated to the PLS 118. In addition, the remote system also may be configured to provide a notification (e.g., transmit a message) upon detection of a transformer overload condition (e.g., the output power exceeding a rating by a predetermined percentage or value) and, in some embodiments that exists for a predetermined duration. This notification may include transformer identifying information (e.g., pole number), be received by the utility provider and used to dispatch personnel to the transformer.

Figure 13:
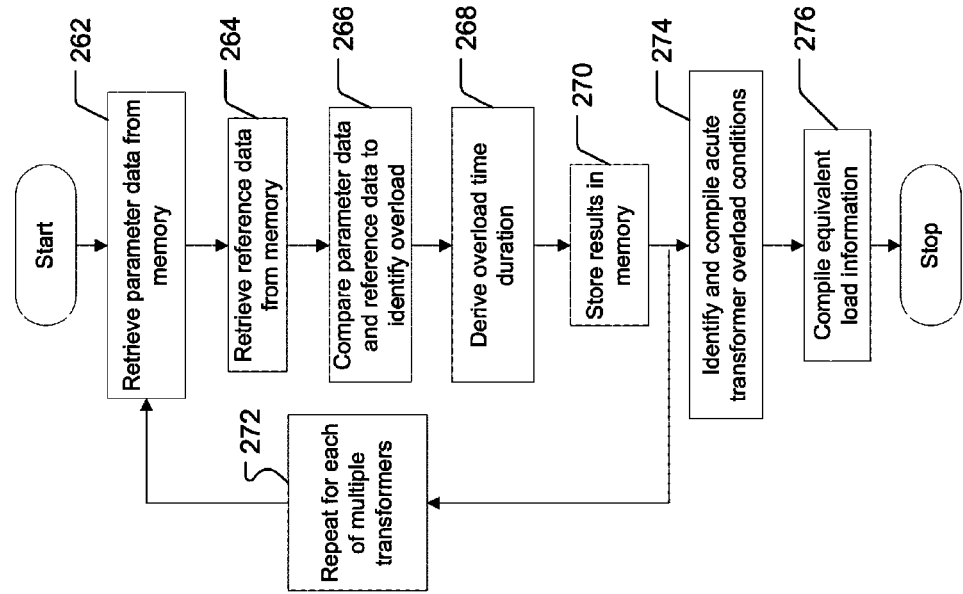
FIG. 13 is a flow chart of a process for reporting distribution transformer overload conditions according to a sample embodiment of the present invention.

FIG. 13 is a flow chart of additional processes that may be performed on the data to report transformer overload conditions. At step 262, the power parameter data for a given transformer for a given time range is retrieved from memory. At step 264 corresponding reference data is retrieved from memory. At step 266 the parameter data is compared to the reference data to identify time (or time periods) where an overload condition occurred. At step 268, the times (or time periods) are accumulated (summed) to determine the cumulative overload duration. At step 270 the results are stored in memory. At step 272, the steps 262-270 may be repeated for other transformers. At step 274 the results may be compiled to provide a transformer overload duration report, which alerts an operator about transformers that exceed the user configurable percentage of the transformer's nameplate rating for the user configurable time duration. For example, such a report may alert an operator of all transformers that have operated at 150% or more of their rated load for at least two hours duration (e.g., within a day, month, or week). Such report may be for a current time period, or for some historic time period.

In another example, at step 276 a transformer sizing report may be generated to show the equivalent load of all distribution transformers for an area of interest for an entire year. Based on such values, planning can be improved to install transformers of a more appropriate size for the historical and expected load patterns. Such report may be of particular use for single phase overhead power distribution networks, single phase underground power distribution networks, and three phase underground power distribution networks.

The methods for detecting distribution transformer overload provide many benefits and advantages to a power distribution network. Various stages of reporting may be implemented to alert operators of acute overload conditions and chronic overload patterns. Utility technicians may better prioritize maintenance, replacement and installation of distribution transformers. Improved prioritizing of the replacement and installation of transformers may minimize transformer failures caused by overloads, and extend the life of installed transformers.

Other advantages also may be achieved. By gathering power distribution parameter data, such as power line current, power line voltage, power factor data, load or other parameter, the efficiency of the power distribution system may be improved. For example, real time monitoring of power line current at many locations (such as many MV power line locations) within the power distribution system may enable switches in the system (MV feeder switches) to be reconfigured to redistribute the load (i.e., the flow of current) in response to measured data. The redistribution may be done manually (e.g., by sending personnel), semi-automatically (e.g., by personnel remotely actuating the switch(es)), and/or automatically (e.g., actuation of the switch(es) via a remote computer executing program code that transmits control information to actuate the switch).

Planning also may be managed more efficiently by monitoring power line distribution parameters at sensor devices 115 located at many power line communication devices 138, 139, 135 positioned throughout the communication and distribution system 104. The current sensor devices 115, voltage sensor devices and other parameter sensor devices 115 may be used to measure the parameters, and store the data in a database (e.g., of the power line server) for use in predicting conditions such as power distribution equipment failures. Thus, upon detecting a certain power distribution condition (e.g., a failure of a transformer, a fault, etc.), the values of the stored parameters just prior to the condition may be analyzed to identify a correlation (e.g., a pattern) between the parameter values and the condition so that when substantially the same parameter value measurements are detected again, the condition may be predicted (and notification transmitted).

Similarly, while the described embodiments communicate data via a power line communication system, the sensor devices 115 may be combined with wireless communication devices (e.g., mobile telephone transceivers, two way wireless pager system transceivers, WiFi transceivers, or other transceivers) to communicate via a wireless data network. In addition, the sensor devices 1115 used for measuring the power described herein may take various forms and be comprised of any implementations of sensors and other software and circuitry suitable for the application and is not limited to the sensor devices described herein. In addition, while the embodiments described above generally describe measuring or determining the output power, the input power may also be used to determine whether the transformer is overloaded.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A method, implemented at least in part by a computer system, of detecting an overload condition of a distribution transformer supplying power to one or more customer premises, comprising:
    determining an output current of the distribution transformer while the distribution transformer is supplying power to the one or more customer premises;
    storing in a memory a threshold current value for the distribution transformer;
    determining whether the output current exceeds the threshold current value for a predetermined time period; and
    if the output current exceeds the threshold current value for the predetermined time period, outputting a first notification.

2. The method of claim 1, further comprising:
    measuring an output voltage of the distribution transformer;
    storing in the memory a threshold voltage;
    comparing the output voltage with the threshold voltage; and
    outputting a second notification if the output voltage is beyond the threshold voltage.

3. The method of claim 1, wherein said outputting a first notification comprises transmitting the first notification over a medium voltage power line.

4. The method of claim 1, wherein said outputting a first notification comprises wirelessly transmitting the first notification.

5. The method of claim 1, wherein said outputting a first notification comprises transmitting information sufficient for determining a location of the distribution transformer.

6. The method of claim 1, further comprising transmitting data of the determined output current to a remote device.

7. The method of claim 6, wherein said determining whether the current output exceeds the threshold current value is performed by the remote device.

8. The method of claim 1, wherein said determining the output current comprises measuring a current traversing a power line via a sensor device that includes a Rogowski coil.

9. The method of claim 1, further comprising:
    storing in the memory a plurality of threshold current values associated with a plurality of transformers;
    receiving data of the output current of a multitude of transformers; and
    determining whether the output current of each of the multitude of transformers exceeds the threshold current value associated with each transformer.

10. The method according to claim 1, further comprising:
receiving program code via a communication from a remote device;
storing the received program code in a memory; and
executing the program code.

11. A method of detecting an overload condition of a distribution transformer supplying power to one or more customer premises, comprising:
measuring a current output of the distribution transformer over a time period;
computing a power output based, at least in part, on the measured current output;
storing in a memory a threshold power value for the distribution transformer;
determining whether the power output exceeds the threshold power value for a predetermined time period; and
if the output power exceeds the threshold power value for the predetermined time period, transmitting a first notification.

12. The method of claim 11, further comprising measuring a voltage output of the distribution transformer.

13. The method of claim 11, wherein said transmitting the first notification comprises transmitting the first notification over a medium voltage power line.

14. The method of claim 11, wherein said transmitting the first notification comprises wirelessly transmitting the first notification.

15. The method of claim 11, wherein said transmitting the first notification comprises transmitting the first notification via a fiber optic communication.

16. The method of claim 11, further comprising transmitting data of the computed power output to a remote device.

17. The method of claim 16, wherein said comparing the power output with the threshold power value is performed by the remote device.

18. The method of claim 11, wherein said measuring a current comprises measuring a current traversing a power line via a sensor device that includes a Rogowski coil.

19. The method of claim 11, wherein said determining the power output comprises averaging the measured current over the time period.

20. The method of claim 11, further comprising:
measuring the output voltage of the distribution transformer;
comparing the output voltage with a threshold voltage; and
transmitting a second notification if the output voltage is beyond the threshold voltage.

21. The method of claim 11, further comprising:
receiving program code via a communication from a remote device;
storing the received program code in a memory; and
executing the program code.

22. A device for detecting an overload condition of a distribution transformer supplying power to one or more customer premises, comprising:
a sensor module configured to measure the power output of the distribution transformer;
a modem;
a memory storing a threshold power value;
a controller in communication with said sensor module, said modem, and said memory and programmed to determine whether the power output exceeds the threshold power value for a predetermined time period; and
wherein said controller is programmed to cause said modem to transmit a first notification if the output power exceeds the threshold power value for the predetermined time period.

23. The device according to claim 22, wherein said modem comprises a wireless modem configured to wirelessly transmit the first notification.

24. The device according to claim 22, wherein said sensor module includes a Rogowski coil.

25. The device according to claim 22, wherein said sensor module is configured to measure the output current and the output voltage of the distribution transformer.

26. The device according to claim 22, wherein said modem comprises a fiber optic transceiver configured to transmit the first notification as a fiber optic communication.

27. The device according to claim 22, wherein said controller is programmed to cause said modem to transmit data of the determined power output to a remote device.

28. The device according to claim 22, wherein said sensor module is configured to measure the output voltage of the distribution transformer;
wherein said memory stores a voltage threshold;
wherein said controller is programmed to determine whether the output voltage is beyond the voltage threshold; and
wherein said controller is programmed to cause said modem to transmit a second notification if the output voltage is beyond the voltage threshold.

29. The device according to claim 22, wherein the first notification includes information sufficient for determining a location of the distribution transformer.

30. The device according to claim 22, wherein said memory stores interval data for taking one or more measurements.

31. The device according to claim 22, wherein said controller is programmed to:
receive program code via said modem;
store received program code in said memory; and
execute said program code.

* * * * *